(12) United States Patent
Nakadaira

(10) Patent No.: US 8,792,535 B2
(45) Date of Patent: Jul. 29, 2014

(54) SEMICONDUCTOR DEVICE, RECEIVER, TRANSMITTER, TRANSCEIVER AND COMMUNICATION SYSTEM

(75) Inventor: Masao Nakadaira, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/612,645

(22) Filed: Sep. 12, 2012

(65) Prior Publication Data
US 2013/0094539 A1    Apr. 18, 2013

(30) Foreign Application Priority Data

Oct. 17, 2011    (JP) .................. 2011-227712

(51) Int. Cl.
H04B 1/00    (2006.01)
H04B 1/02    (2006.01)
H04B 1/38    (2006.01)
H03L 7/085   (2006.01)
H04B 1/06    (2006.01)

(52) U.S. Cl.
CPC    *H03L 7/085* (2013.01); *H04B 1/02* (2013.01); *H04B 1/38* (2013.01); *H04B 1/06* (2013.01)
USPC ............ 375/147; 375/146; 375/375; 375/376

(58) Field of Classification Search
USPC ................. 375/147, 146, 375, 376
See application file for complete search history.

(56) References Cited

U.S. PATENT DOCUMENTS

| 7,742,556 | B1* | 6/2010 | Qian et al. | 376/376 |
|---|---|---|---|---|
| 8,265,201 | B1* | 9/2012 | Wang et al. | 375/326 |
| 2010/0188129 | A1* | 7/2010 | Ma | 327/294 |
| 2011/0037505 | A1 | 2/2011 | Kawamoto | |
| 2012/0049910 | A1 | 3/2012 | Aoyama | |

FOREIGN PATENT DOCUMENTS

| JP | 2011-41121 (A) | 2/2011 |
|---|---|---|
| JP | 2012-49863 (A) | 3/2012 |

* cited by examiner

Primary Examiner — Kabir A Timory
(74) Attorney, Agent, or Firm — McGinn IP Law Group, PLLC

(57) ABSTRACT

A semiconductor device includes: a clock and data recovery unit to which a receive signal is inputted and which extracts, based on an operation clock signal, a clock signal and a data signal from the receive signal; a frequency error adjusting unit which generates a frequency error signal indicating a frequency error between the clock signal extracted from the receive signal and the operation clock signal; a frequency error signal storage unit which stores the frequency error signal; an operation clock generation unit which controls, based on the frequency error signal, a frequency of the operation clock signal; and an SSCG unit which, based on the value of the frequency error signal stored in the frequency error signal storage unit, varies the operation clock signal generated by the operation clock generation unit by spreading the spectrum of the operation clock signal.

20 Claims, 19 Drawing Sheets

COMMUNICATION SYSTEM

SEMICONDUCTOR DEVICE, RECEIVER, TRANSMITTER, TRANSCEIVER AND COMMUNICATION SYSTEM

CROSS-REFERENCE TO RELATED APPLICATIONS

The disclosure of Japanese Patent Application No. 2011-227712 filed on Oct. 17, 2011 including the specification, drawings and abstract is incorporated herein by reference in its entirety.

BACKGROUND

The present invention relates to a semiconductor device, a receiver, a transmitter, a transceiver, and a communication system, and more particularly to a semiconductor device, a receiver, a transmitter, a transceiver, and a communication system having a function for transmitting/receiving data in synchronization with a clock signal.

In recent years, a serial digital transmission system is used in many cases for communications between devices coupled to a communication network system and for data exchanges inside a personal computer. In a serial digital transmission system, serial signals are exchanged at high speed between semiconductor devices.

In a serial digital transmission system, a data signal is transmitted with a clock signal superimposed thereon and, on the receiving side, the clock signal synchronized with the data signal is reproduced using a clock and data recovery circuit. When, for data exchanges between semiconductor devices, high-speed digital signals are used (based on a serial digital transmission system), effects of harmonics of digital signals become conspicuous.

Harmonics of a digital signal can cause, as unwanted radiation noise, various problems. For example, unwanted radiation noise superimposed on a communication channel can cause communication failure. Unwanted radiation noise can also cause audio and video quality deterioration in electronic devices such as radios and TVs.

Hence, an SSCG (Spread Spectrum Clock Generator) is used to reduce unwanted radiation noise by slightly shifting the frequency of a clock signal used in a serial digital transmission system from the peak of an oscillation frequency so as not to fix the clock signal to a single frequency.

In Japanese Unexamined Patent Publication No. 2011-041121, a transceiver provided with a PLL circuit which corrects a transmit clock signal using the difference between the frequency of receive data (data received) and the frequency of an operation clock signal is disclosed. Also, the transceiver disclosed in Japanese Unexamined Patent Publication No. 2011-041121 includes an SSCG so as to reduce unwanted radiation noise generated from data received and transmitted.

SUMMARY

The disclosure in the above prior-art document, Japanese Unexamined Patent Publication No. 2011-041121, is incorporated herein by reference in its entirety. The disclosure will be analyzed below from the viewpoint of the present invention.

As mentioned above, a technique used to generate a transmit clock signal by feeding back the frequency error between the frequencies of the receive data and the operation clock signal to a PLL circuit is disclosed in Japanese Unexamined Patent Publication No. 2011-041121.

In the above prior-art technique, the spectrum of the receive data is spread by an SSCG unit, so that, when the receive data frequency varies, the transmit data frequency also varies. FIG. 2 shows examples of receive data and transmit data received/transmitted by a transceiver using a serial digital transmission system. As shown in an upper part of FIG. 2, when SSC is applied to the receive data, SSC is also applied to the transmit data.

However, when the receive data frequency does not vary (SSC has not been applied), SSC is not applied to the transmit data, either (see the lower part of FIG. 2).

In the transceiver disclosed in Japanese Unexamined Patent Publication No. 2011-041121, whether SSC is applied to the transmit data depends on whether SSC has been applied to the receive data. Therefore, when SSC has not been applied to the receive data, it is unavoidable that SSC is not applied to the transmit data, either. Namely, it is not possible to apply SSC to the transmit data alone.

As described above, there is a problem to be solved regarding the application of SSC to the transmit clock signal (transmit data) generated based on the frequency error between the receive data and the operation clock signal. Hence, realization of a semiconductor device, a receiver, a transmitter, a transceiver and a communication system which can generate a transmit clock signal based on a frequency error and which allow SSC to be optionally applied to the transmit data is desired.

According to a first aspect of the present invention, there is provided a semiconductor device including: a clock and data recovery unit to which a receive signal is inputted and which extracts, based on an operation clock signal, a clock signal and a data signal from the receive signal; a frequency error adjusting unit which generates a frequency error signal indicating a frequency error between the clock signal extracted from the receive signal and the operation clock signal; a frequency error signal storage unit which stores the frequency error signal; an operation clock generation unit which controls, based on the frequency error signal, a frequency of the operation clock signal; and an SSCG unit which, based on the value of the frequency error signal stored in the frequency error signal storage unit, varies the operation clock signal generated by the operation clock generation unit by spreading the spectrum of the operation clock signal.

According to a second aspect of the present invention, there is provided a receiver including the semiconductor device according to the first aspect of the present invention.

According to a third aspect of the present invention, there is provided a transmitter including the semiconductor device according to the first aspect of the present invention.

According to a fourth aspect of the present invention, there is provided a transceiver including the semiconductor device according to the first aspect of the present invention.

According to a fifth aspect of the present invention, there is provided a communication system which includes a first transceiver and a second transceiver each being capable of generating an operation clock signal, transmitting data in synchronization with the operation clock signal, and extracting data from a receive signal transmitted from a transmitting source in synchronization with an operation clock signal used at the transmitting source. In the communication system, each of the first transceiver and the second transceiver has an SSCG function which can vary the operation clock signal for use in transmitting the data by spreading the spectrum of the operation clock signal. Also, in the communication system, the second transceiver receives a signal transmitted from the first transceiver with the SSCG function of the first transceiver off, the second transceiver having a frequency error correction mode in which a frequency error between the operation clock signal of the first transceiver and the operation clock signal of the second transceiver is determined based on the signal received from the first transceiver and the operation clock signal of the second transceiver and in which the frequency of the operation clock signal of the second transceiver is corrected based on the determined frequency error. Furthermore, in the communication system, when it is determined, based on the signal received from the first transceiver, that the SSCG function of the first transceiver is on, the second transceiver performs communication inhibiting the SSCG function of the second transceiver and, when it is determined, based on the signal received from the first transceiver, that the SSCG function of the first transceiver is off, the second transceiver cancels the inhibition of the SSCG function of the second transceiver and performs communication based on the operation clock signal corrected in the frequency error correction mode.

According to the respective aspects of the present invention, a semiconductor device, a receiver, a transmitter, a transceiver, and a communication system which are capable of generating a transmit clock signal based on a frequency error and which allow SSC to be optionally applied to the transmit data are provided.

DETAILED DESCRIPTION

Figure 1:
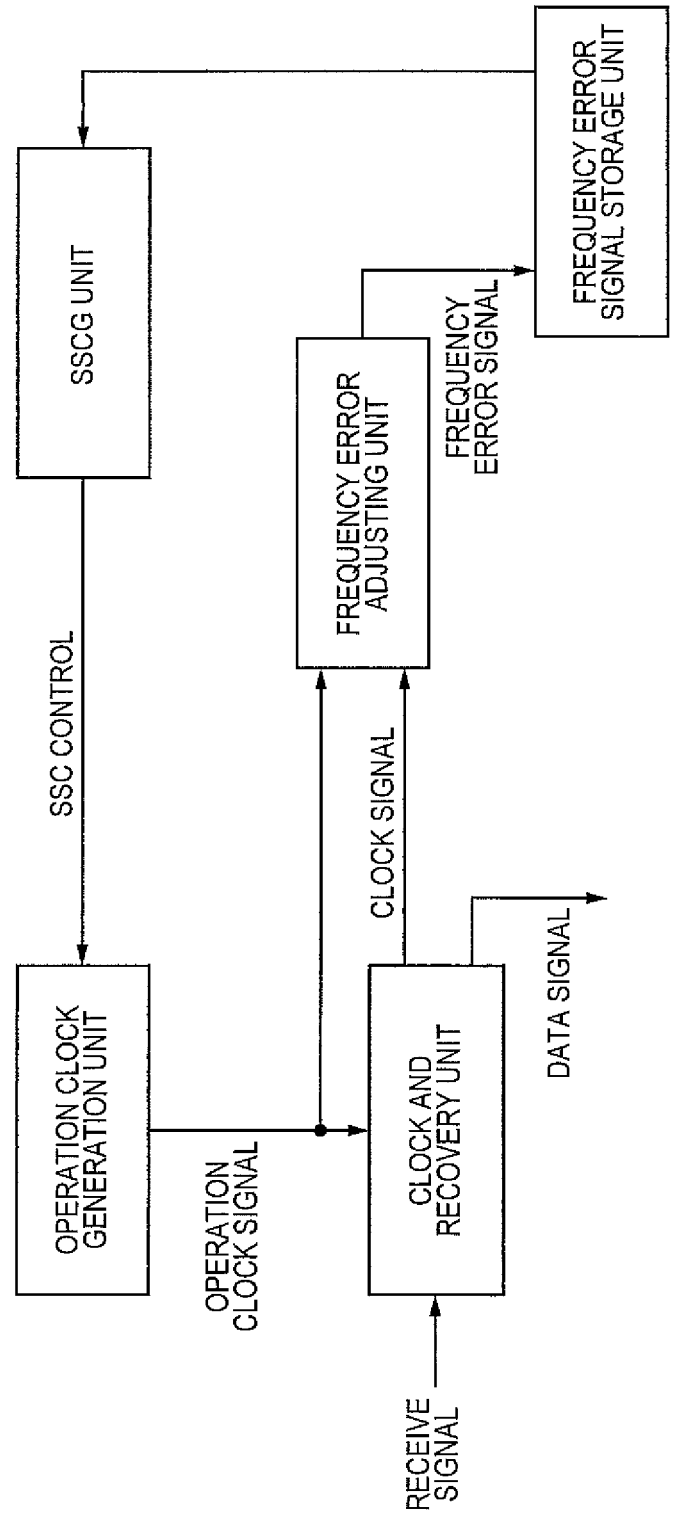
FIG. 1 is a diagram for generally describing an embodiment of the present invention.
Figure 2:
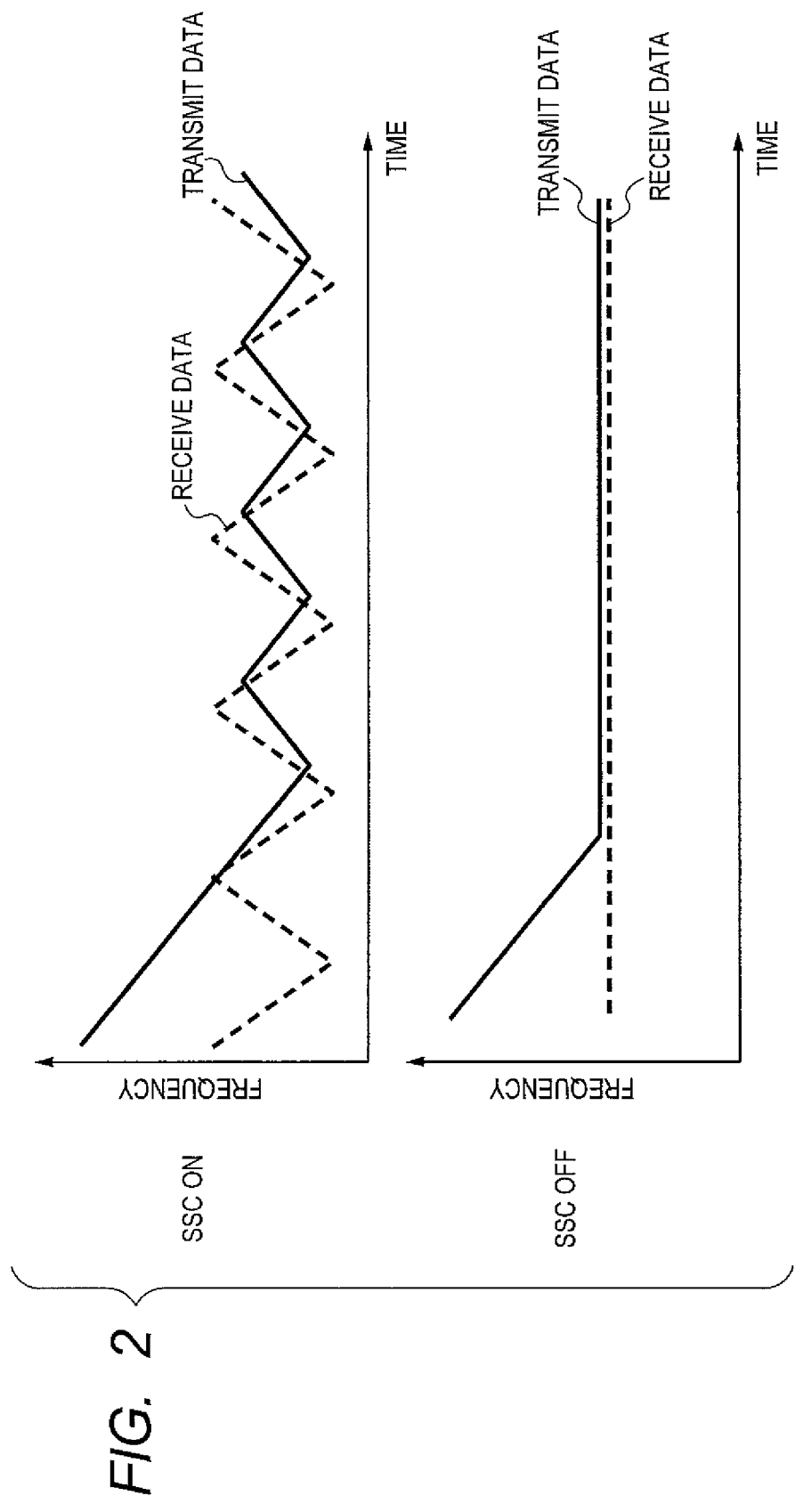
FIG. 2 shows examples of receive data and transmit data received/transmitted by a transceiver using a serial digital transmission system.

First, an embodiment of the present invention will be outlined with reference to FIG. 1. Reference numerals and symbols denoting various elements shown in the attached drawings are just for assisting the reader in understanding the following description, and they are not intended to define the present invention to any embodiment shown in the attached drawings.

As described in the foregoing, when a transmit clock signal is generated based on the frequency error between receive data (data received) and an operation clock signal, whether or not SSC is applied to transmit data depends on whether or not SSC has been applied to the receive data. In a case where SSC has not been applied to the receive data, therefore, SSC cannot be applied to the transmit data to be transmitted. Namely, SSC cannot be applied to the transmit data alone. Hence, realization of a semiconductor device, a receiver, a transmitter, a transceiver and a communication system which can generate a transmit clock signal based on a frequency error and which allow SSC to be optionally applied to data to be transmitted is desired.

FIG. 1 shows an example of a semiconductor device according to the present embodiment.

The semiconductor device shown in FIG. 1 includes a clock and data recovery unit to which a receive signal is inputted and which extracts, based on an operation clock signal, a clock signal and a data signal from the receive signal, a frequency error adjusting unit which obtains a frequency error signal between the clock signal extracted from the receive signal and the operation clock signal, a frequency error signal storage unit which stores the frequency error signal, an operation clock generation unit which controls, based on the frequency error signal, the frequency of the operation clock signal, and an SSCG (Spread Spectrum Clock Generator) unit which varies, based on the frequency error signal stored in the frequency error signal storage unit, the operation clock signal generated by the operation clock generation unit by spreading the spectrum of the operation clock signal.

In cases where SSC has not been applied to the receive data, there is a frequency error between the receive clock signal reproduced from the receive data and the operation clock signal. This is because the clock generating sources (for example, crystal oscillators) used to generate the respective clock signals differ from each other in accuracy. To solve this, the frequency error adjusting unit generates a frequency error signal between the receive clock signal and the operation clock signal and feeds back the frequency error signal to the operation clock generation unit generating the operation clock signal. Based on the frequency error signal, the operation clock generation unit controls the frequency of the operation clock signal in a direction to decrease the frequency error, thereby causing the frequency of the operation clock signal to track the frequency of the receive clock signal.

When the frequency of the receive clock signal varies (with SSC applied to the receive data), the frequency of the operation clock signal tracking the receive clock signal also varies (SSC is also applied to the transmit data). In cases where SSC has not been applied to the receive data, however, SSC cannot be applied to the transmit data. To solve this, prior to data transmission and reception, the frequency error signal is generated using the clock and data recovery unit, frequency error adjusting unit and operation clock generation unit, and the value of the frequency error signal thus generated is stored in the frequency error signal storage unit. Based on the frequency error value stored in the frequency error signal storage unit, the operation clock generation unit can generate an operation clock signal of a frequency approximately coinciding with the frequency of the receive clock signal (of a frequency identical with the frequency obtained by making the operation clock signal track the receive clock signal).

Furthermore, in cases where SSC has not been applied to the receive data, the operation clock signal is not made to track the receive clock signal reproduced from the receive data, and the operation clock generation unit is made to operate (made to generate the operation clock signal) with an offset frequency applied for frequency adjustment. At this time, the value of the frequency error signal that the SSCG unit stored in the frequency error signal storage unit when spreading the spectrum of the operation clock signal is used as the offset frequency. In this way, even in cases where SSC has not been applied to the receive data, the frequency error between the receive data and the operation clock signal can be removed and the frequency of the operation clock signal can be varied by spreading the spectrum of the operation clock signal.

There can also be cases where applying SSC to the transmit data is not desired. In such cases, the operation clock generation unit generates the operation clock signal based on the frequency error stored in the frequency error signal storage unit and does not make the operation clock signal track the receive clock signal reproduced from the receive data. Also, in such cases, the SSCG unit does not spread the spectrum of the operation clock signal. In this way, regardless of whether or not SSC has been applied to the receive data RD, an operation clock signal of a frequency approximately coinciding with the frequency of the receive clock signal can be generated without applying SSC to the transmit data. Namely, a semiconductor device can be provided which allows whether to apply SSC to the transmit data to be optionally determined.

The possible modes of the present invention include the following.

Mode 1

A semiconductor device according to the first aspect described above is provided.

Mode 2

The frequency error signal storage unit is preferably provided with a non-volatile memory to store the frequency error signal.

Mode 3

The semiconductor device is preferably further provided with a deserializer which converts the data signal that the clock and data recovery unit serially extracted from the receive signal into a parallel data signal.

Mode 4

The semiconductor device is preferably further provided with a frequency error signal update control unit which obtains a maximum value and a minimum value of the frequency error signal over a predetermined period of time and which stores, when the difference between the maximum value and the minimum value is brought to or below a predetermined value, the frequency error signal in the frequency error signal storage unit.

Mode 5

Preferably, in the semiconductor device: a maximum value, a minimum value and an average value of the frequency error signal over a predetermined, period of time are obtained and the average value is stored in the frequency error signal storage unit; and, when the difference between the maximum value and the minimum value is equal to or smaller than a predetermined value, the SSCG unit spreads the spectrum of the operation clock signal generated by the operation clock generation unit based on the average value stored in the frequency error signal storage unit instead of the frequency error signal stored in the frequency error signal storage unit and, when the difference between the maximum value and the minimum value is larger than the predetermined value, the SSCG unit does not spread the spectrum of the operation clock signal generated by the operation clock generation unit.

Mode 6

Preferably, the semiconductor device has a frequency error signal storing mode in which the frequency error signal storage unit is controlled to allow writing thereto.

Mode 7

Preferably, in the semiconductor device, the clock and data recovery unit, the frequency error adjusting unit, the frequency error signal storage unit, the SSCG unit, and the operation clock generation unit are formed over a same semiconductor substrate.

Mode 8

Preferably, the semiconductor device further includes a transmission unit which serially outputs data in synchronization with the operation clock signal.

Mode 9

Preferably, the semiconductor device further includes a serializer which generates a transmit signal by converting a data signal to be outputted in synchronization with the operation clock signal.

Mode 10

Preferably, in the semiconductor device, the receive signal is transmitted and received in conformity with the serial ATA standard.

Mode 11

A receiver according to the second aspect described above is provided.

Mode 12

A transmitter according to the third aspect described above is provided.

Mode 13

A transceiver according to the fourth aspect described above is provided.

Mode 14

A communication system according to the fifth aspect described above is provided.

In the following, concrete embodiments of the present invention will be described in detail with reference to drawings.

First Embodiment

Figure 3:
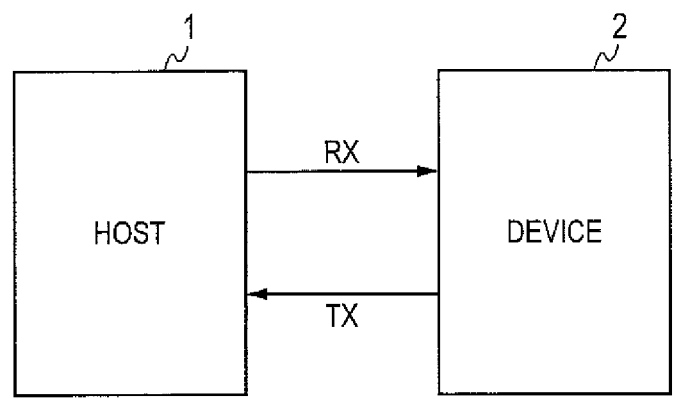
FIG. 3 shows an example of communication system according to a first embodiment of the present invention.

A first embodiment of the present invention will be described in detail with reference to drawings. FIG. 3 shows an example of communication system according to the first embodiment of the present invention.

The communication system shown in FIG. 3 includes a host 1 and a device (semiconductor device) 2. The host 1 and the device 2 realize bi-directional communications using a serial digital transmission system. The host 1 generates a clock signal for use in data transmission using a high-accuracy clock generating source and transmits data superimposed with the clock signal to the device 2.

Furthermore, the host 1 spreads, using an SSCG circuit, the spectrum of the clock signal used when transmitting data (varies the clock signal frequency). The device 2, on the other hand, generates, using a clock generating source which is low in accuracy compared with the clock signal used by the host 1, a transmit clock signal (equivalent to the foregoing operation clock signal) for use in exchanging data with the host 1.

It may be considered to use a crystal oscillator to generate a high-accuracy clock signal for use by the host 1 whereas using a ceramic oscillator to generate a low-accuracy clock signal for use by the device 2. Ceramic oscillators are low in accuracy, but they are advantageous costwise. As described above, the host 1 and the device 2 engage in bi-directional communications. In the following, for the sake of descriptive convenience, the signal received by the device 2 will be denoted by "RX" and the signal outputted from the device 2 will be denoted by "TX".

In exchanging data with the device 2, the host 1 spreads, using the SSCG circuit disclosed in Japanese Unexamined Patent Publication No. 2011-041121, the spectrum of the high-accuracy clock signal generated using, for example, a crystal oscillator.

In the following, the device 2 will be described, centering on its configuration and operation.

Figure 4:
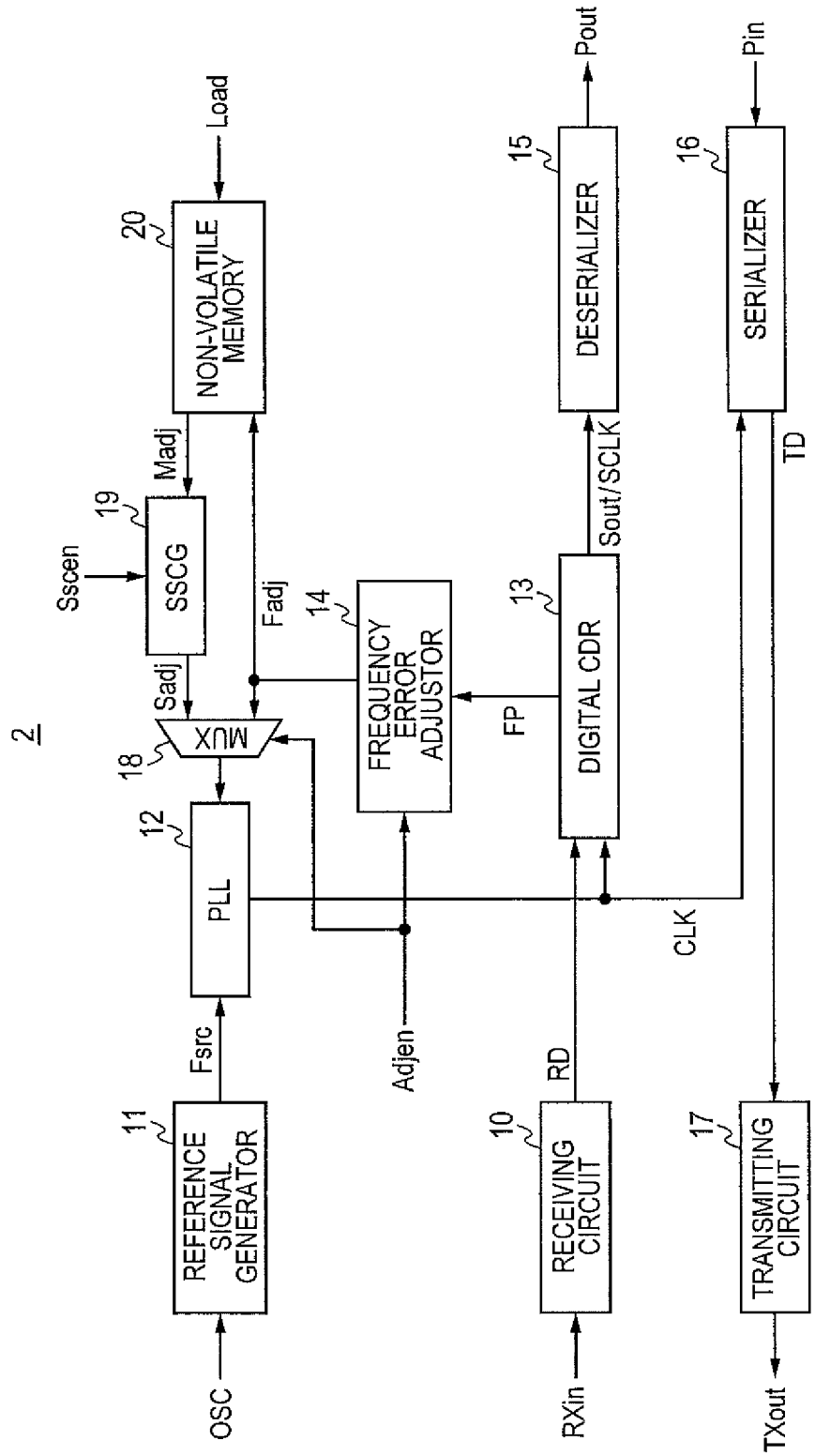
FIG. 4 shows an example internal configuration of a device 2 shown in FIG. 3.

FIG. 4 shows an example internal configuration of the device 2 shown in FIG. 3.

The device 2 includes a receiving circuit 10, a reference signal generator 11, a PLL (Phase Locked Loop) circuit 12, a clock and data recovery circuit (for example, a digital CDR) 13, a frequency error adjustor 14, a deserializer 15, a serializer 16, a transmitting circuit 17, an MUX circuit 1B, an SSCG circuit 19, and a non-volatile memory 20.

In the device 2, a reception system circuit is comprised of the receiving circuit 10, the digital CDR 13 and the deserializer 15. A transmission system circuit is comprised of the serializer 16 and the transmitting circuit 17.

The receiving circuit 10 functions as an input buffer. The receiving circuit 10 receives a receive signal RXin and transfers the receive signal as receive data RD to a rear-stage circuit. There are cases in which the receiving circuit 10 includes an equalizer circuit for correcting the frequency characteristic of the transmission path.

The reference signal generator 11 together with a ceramic oscillator makes up an oscillator circuit and generates a reference clock signal Fsrc based on an oscillation signal OSC generated by a ceramic oscillator.

The PLL circuit 12 receives a frequency adjustment signal Fadj outputted from the frequency error adjustor 14 or an SSC control signal Sadj outputted from the SSCG circuit 19. The MUX circuit 18 makes switching between the frequency adjustment signal Fadj and the SSC control signal Sadj to be inputted to the PLL circuit. The PLL circuit 12 controls the frequency dividing ratio based on the frequency adjustment signal Fadj or the SSC control signal Sadj, and generates a transmit clock signal CLK. The transmit clock signal CLK is outputted to the digital CDR 13 and the serializer 16.

The digital CDR 13, used as a clock and data recovery circuit 13 in the present embodiment, receives the receive data RD and the transmit clock signal CLK. The digital CDR 13 is comprised of logic circuits for handling binary information and outputs a digital signal representing binary information. The digital CDR 13 generates phase difference signals which indicate a phase delay or advance between a receive clock signal RCLK generated from the transmit clock signal CLK and the receive data RD. The digital CDR 13 includes a phase tracking loop to perform control to make the phase of the receive clock signal RCLK track the phase of the receive data RD and a frequency tracking loop to perform control to make the frequency of the receive clock signal RCLK track the frequency of the receive data RD. The digital CDR 13 extracts, from the receive data RD, a data signal Sout and a synchronous clock signal SCLK corresponding to the data signal Sout, and controls the phase and frequency of the receive clock signal RCLK.

The frequency error adjustor 14 generates the frequency adjustment signal Fadj based on the frequency difference signal FP. The frequency error adjustor 14 also increases or decreases the value indicated by the frequency adjustment signal Fadj based on the frequency difference signal FP. The frequency error adjustor 14 is activated or deactivated based on a frequency error adjustment enable signal Adjen.

Details of the digital CDR 13, frequency error adjustor 14 and PLL circuit 12 will be described later.

The deserializer 15 converts, based on the synchronous clock signal SCLK, the data signal Sout inputted as serial data into parallel data. The data signal outputted as parallel data from the deserializer 15 will be denoted by "Pout".

The serializer 16 converts, based on the transmit clock signal CLK, a data signal Pin given as parallel data into serial data. The serialized transmit data is denoted by "TD". The transmitting circuit 17 is an output buffer. It power-amplifies the transmit data TD and outputs the resultant data as a transmit signal TXout.

The MUX circuit 18 outputs, based on the frequency error adjustment enable signal Adjen, either one of the frequency adjustment signal Fadj and the SSC control signal Sadj to the PLL circuit 12.

The SSCG circuit 19 realizes SSC by controlling the frequency dividing ratio of the PLL circuit 12 using, for example, a $\Delta\Sigma$ modulator disclosed in Japanese Unexamined Patent Publication No. 2011-041121. The SSC control signal Sadj generated by the SSCG circuit 19 is outputted to the MUX circuit 18. The SSCG circuit 19 is activated or deactivated based on the SSCG enable signal Sscen.

The non-volatile memory 20 stores the frequency adjustment signal Fadj inputted when a Load signal is activated. The frequency adjustment signal Fadj stored in the non-volatile memory 20 can be read out from the SSCG circuit 19 as a frequency adjustment signal Madj.

The device 2 of the present embodiment performs communications using data signals synchronized with a transmit clock signal. When a single-frequency signal is used as the transmit clock signal, the peak value of unwanted radiation increases to degrade the EMI (Electro-Magnetic Interference) characteristics. The device 2 according to the present embodiment can receive data signals to which SSC has been applied as a transmit clock signal. Hence, the digital CDR 13 included in the device 2 is required to make the frequency of the synchronous clock signal SCLK track the variation caused by spectrum spreading. The digital CDR 13 has a frequency tracking loop for the tracking operation. Based on the signal generated by the digital CDR 13, the device 2 controls the PLL circuit 12 to control the frequency of the transmit clock signal CLK.

The configuration of the digital CDR 13 will be described in detail below.

Figure 5:
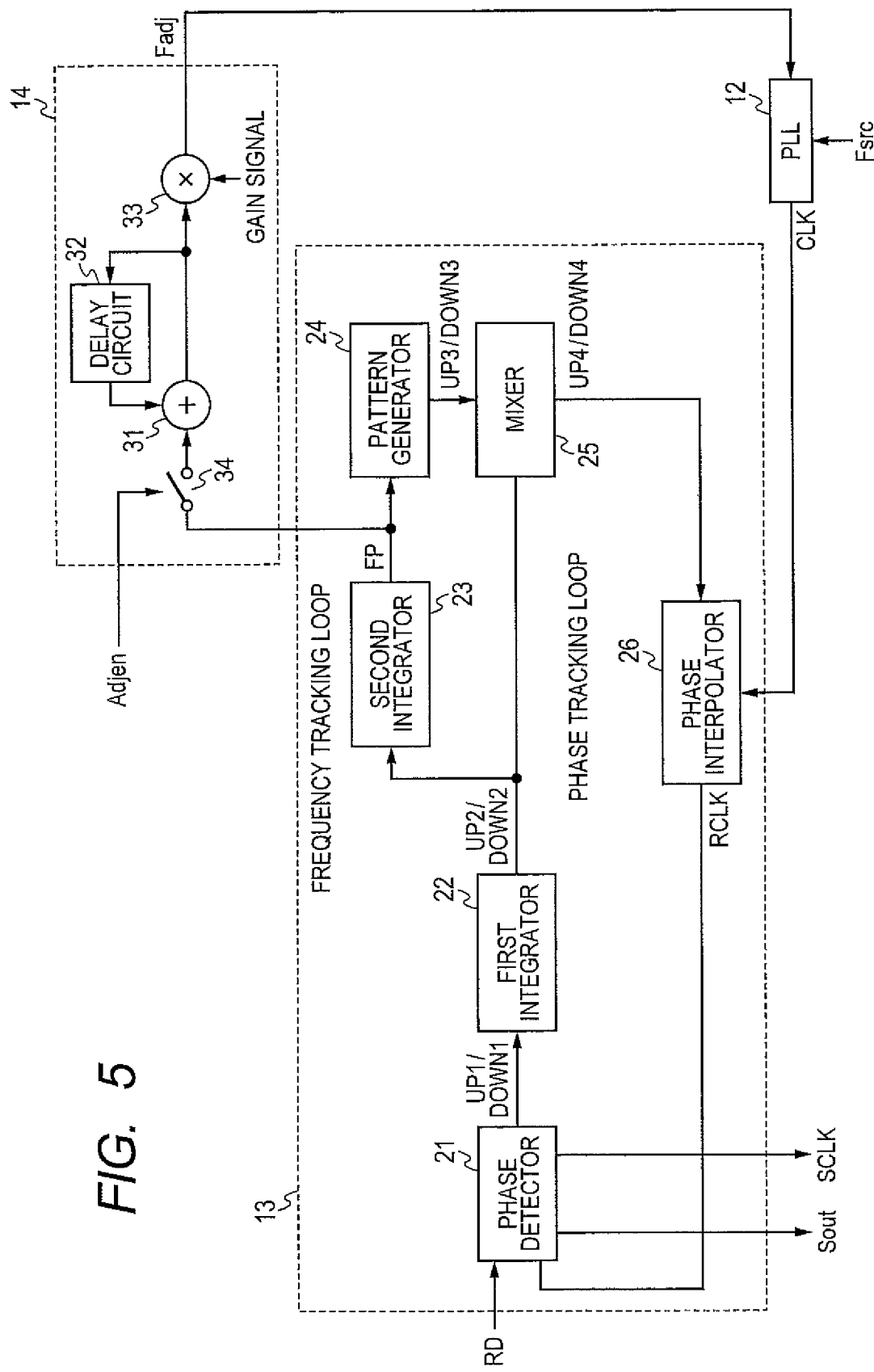
FIG. 5 shows example internal configurations of a digital CDR 13 and a frequency error adjustor 14 shown in FIG. 4.

FIG. 5 shows example internal configurations of the digital CDR 13 and the frequency error adjustor 14.

The digital CDR 13 includes a phase detector 21, a first integrator 22, a second integrator 23, a pattern generator 24, a mixer 25 and a phase interpolator 26.

In the digital CDR 13, a phase tracking loop is comprised of the phase detector 21, the first integrator 22, the mixer 25 and the phase interpolator 26. Also in the digital CDR 13, a frequency tracking loop is comprised of the phase detector 21, the first integrator 22, the second integrator 23, the pattern generator 24, the mixer 25 and the phase interpolator 26. The output from the second integrator 23 is used as the frequency difference signal FP.

The phase detector 21 detects the phase difference between the receive clock signal RCLK and the receive data RD and updates the polarity values indicated by the phase difference signals. The phase detector 21 outputs the receive clock signal RCLK as a synchronous clock signal SCLK and extracts a data signal Sout from the receive data RD. To be more concrete, the receive clock signal RCLK used as the synchronous clock signal SCLK is inputted to the phase detector 21. The receive clock signal RCLK contains a first receive clock signal RCLK1 and a second receive clock signal RCLK3. The second receive clock signal RCLK3 differs 180° in phase from the first receive clock signal RCLK1. The phase detector 21 outputs an up signal UP1 and a down signal DOWN1 as phase difference signals. When the synchronous clock signal SCLK (for example, the first receive clock signal RCLK1) is behind the receive data RD in phase, the phase detector 21 sets the up signal UP1 to a first logic level (for example, a high level) and the down signal DOWN1 to a second logic level (for example, a low level). When the synchronous clock signal SCLK is ahead of the receive data RD in phase, the phase detector 21 sets the up signal UP1 to the low level and the down signal DOWN1 to the high level.

Figure 6:
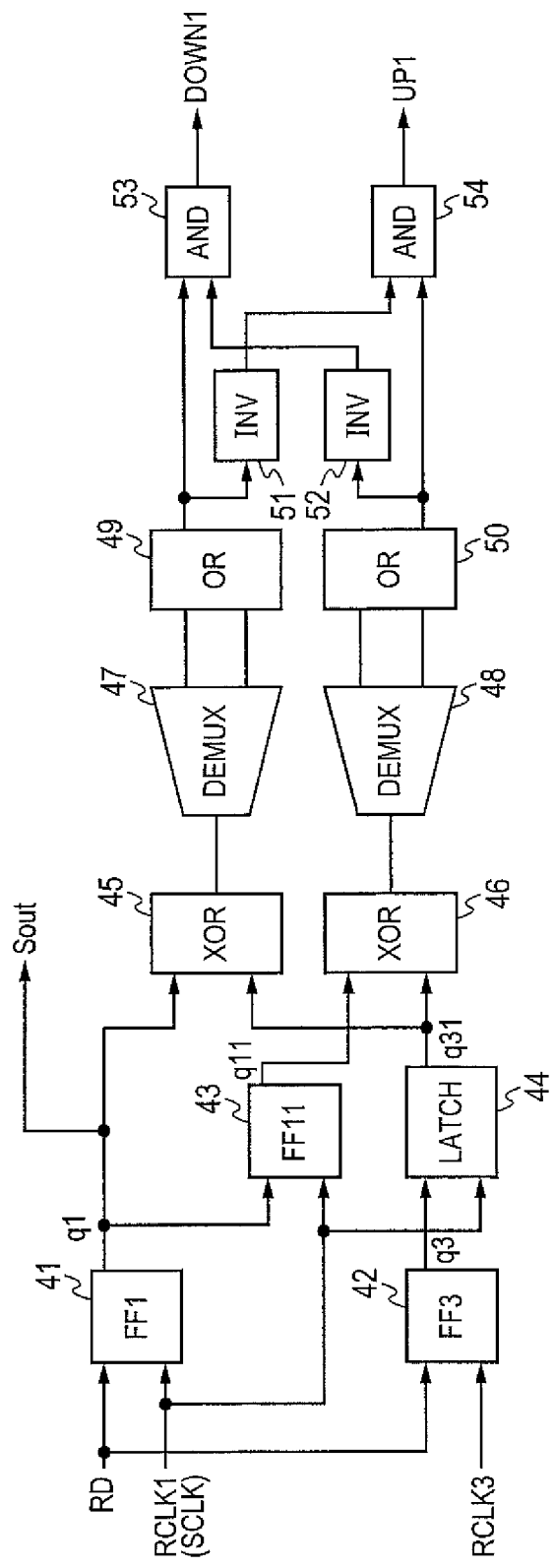
FIG. 6 shows an example internal configuration of a phase detector 21 shown in FIG. 5.

FIG. 6 shows a block diagram of the phase detector 21. As shown in FIG. 6, the phase detector 21 is comprised of logic circuits only. The configuration shown in FIG. 6 is an example in which data of 1.5 Gbps is received using a two-phase 1.5-GHz clock signal. The phase detector 21 includes a first flip-flop 41, a second flip-flop 42, a third flip-flop 43, a latch 44, a first exclusive OR circuit (XOR) 45, a second exclusive OR circuit (XOR) 46, a first demultiplexer (DEMUX circuit) 47, a second demultiplexer (DEMUX circuit) 48, a first OR circuit 49, a second OR circuit 50, a first inverter 51, a second inverter 52, a first AND circuit 53, and a second AND circuit 54.

The first flip-flop 41 receives the receive data RD inputted to a data input terminal thereof and the receive clock signal RCLK1 inputted to a clock terminal thereof. The first flip-flop 41 is an edge-triggered flip-flop. The second flip-flop 42 receives the receive data RD inputted to a data input terminal thereof and the receive clock signal RCLK3 reverse-phased relative to the receive clock signal RCLK1 and inputted to a clock terminal thereof. The third flip-flop 43 receives an output q1 outputted from the first flip-flop 41 and inputted to a data input terminal thereof and the receive clock signal RCLK1 inputted to a clock terminal thereof. The latch 44 receives an output q3 outputted from the second flip-flop 42 and inputted to a data input terminal thereof and the receive clock signal RCLK1 inputted to a clock terminal thereof. The latch 44 is a through latch.

The first exclusive OR circuit (XOR) 45 receives the output q1 from the first flip-flop 41 and an output q31 from the latch 44. The second exclusive OR circuit (XOR) 46 receives an output q11 from the third flip-flop 43 and the output q31 from the latch 44. The first and second demultiplexers (DEMUX circuits) 47 and 48 receive the serial outputs of the first and second exclusive OR circuits (XORs) 45 and 46, respectively, and respectively output the received data as parallel data. The first OR circuit 49 obtains a logical sum of outputs of the first demultiplexer 47. The second OR circuit 50 obtains a logical sum of outputs of the second demultiplexer 48. The first inverter 51 inverts the output of the first OR circuit 49 and outputs the inverted output to the second AND circuit 54. The second inverter 52 inverts the output of the second OR circuit 50 and outputs the inverted output to the first AND circuit 53. The first AND circuit 53 obtains a logical product of the output of the first OR circuit 49 and the inverted output of the second OR circuit 50 outputted via the second inverter 52. The second AND circuit 54 obtains a logical product of the output of the second OR circuit 50 and the inverted output of the first OR circuit 49 outputted via the first inverter 51. The output q1 of the first flip-flop 41 is outputted as a data signal Sout. The receive clock signal RCLK1 is outputted as the synchronous clock signal SCLK.

The phase detector 21 configured as described above sets the up signal UP1 to a high level and the down signal DOWN1 to a low level when the receive data RD changes between rising of the receive clock signal RCLK1 and rising of the receive clock signal RCLK3. On the other hand, when the receive data RD changes between rising of the receive clock signal RCLK3 and rising of the receive clock signal RCLK1, the phase detector 21 sets the up signal UP1 to a low level and the down signal DOWN1 to a high level. In cases where each demultiplexer provides two parallel outputs, the clock signal (not shown) supplied to the circuits in the stages following the phase detector 21 is of a frequency equaling one half the frequency of the receive clock signal inputted to the phase detector 21.

The circuits in the stages following the phase detector 21 will be described below. The first integrator 22 increments/decrements a first count value based on the phase difference signals (for example, the up signal UP1 and down signal DOWN1) and, when the first count value reaches a predetermined value, outputs an up signal UP2 or down signal DOWN2. Namely, the first integrator 22 integrates the polarity values indicated by the phase difference signals. Note that the up signal UP2 is a first up signal and that the down signal DOWN2 is a first down signal.

To be concrete, an up/down counter is used as the first integrator 22. The first integrator 22 has an upper-limit count value and a lower-limit count value set therein. When the up signal UP1 is at a high level, the first integrator 22 increments the first count value based on the clock signal. When the down signal DOWN1 is at a high level, the first integrator 22 decrements the first count value based on the clock signal. When the first count value reaches the upper-limit value, the first integrator 22 sets the up signal UP2 to a high level. When the first count value reaches the lower-limit value, the first integrator 22 sets the down signal DOWN2 to a high level.

The second integrator 23 increments/decrements a count value based on the up signal UP2 and down signal DOWN2, and outputs the count value as the frequency difference signal FP. To be more concrete, the second integrator 23 is comprised of an up/down counter. When the up signal UP1 is at a high level, the second integrator 23 increments a second count value based on the clock signal. When the down signal DOWN1 is at a high level, the second integrator 23 decrements the second count value based on the clock signal. The second integrator 23 outputs the second count value as the frequency difference signal FP. In the present embodiment, the second integrator 23 has a configuration in which an intermediate frequency difference signal is generated by integrating the up signal UP2 and down signal DOWN2 and in which the second count value is incremented/decremented based on the intermediate frequency difference signal.

The pattern generator 24 generates an up signal UP3 and a down signal DOWN3 at predetermined intervals based on the frequency difference signal FP. The up signal UP3 is a second up signal. The down signal DOWN3 is a second down signal.

Figure 7:
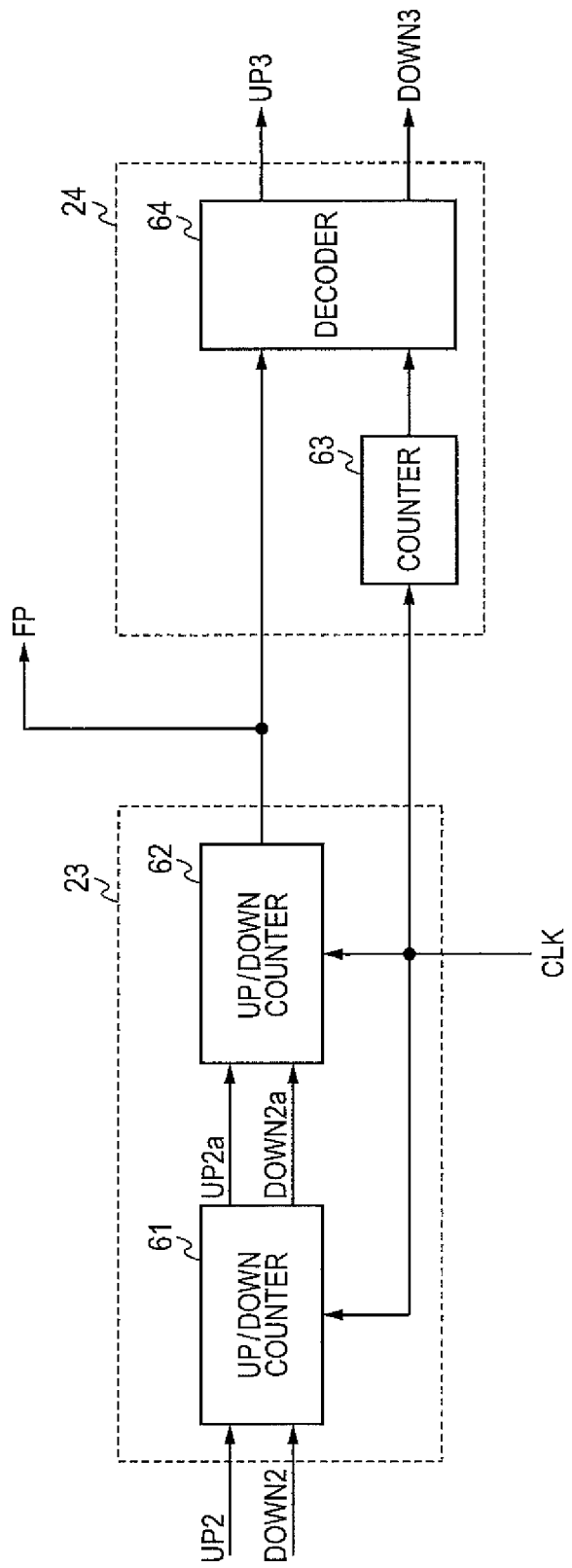
FIG. 7 shows example internal configurations of a second integrator 23 and a pattern generator 24 shown in FIG. 5.

FIG. 7 is a detailed block diagram showing the second integrator 23 and the pattern generator 24. The second integrator 23 and the pattern generator 24 will be described in detail with reference to FIG. 7. As shown in FIG. 7, the second integrator 23 has an up/down counter 61 and an up/down counter 62. The pattern generator 24 has a counter 63 and a decoder 64.

The up/down counter 61 has an upper-limit count value and a lower-limit count value set therein. When the up signal UP2 is at a high level, the up/down counter 61 increments the integrated value based on the clock signal. When the down signal DOWN2 is at a high level, the up/down counter 61 decrements the integrated value based on the clock signal. When the integrated value reaches the upper-limit count value, the up/down counter 61 sets the up signal UP2a to a high level. When the integrated value reaches the lower-limit count value, the up/down counter 61 sets the down signal DOWN2a to a high level.

The up/down counter 62 with a count width set to 5 bits outputs the second count value in a range of −31 to +31. The second count value is used as the frequency difference signal FP. When the up signal UP2a is at a high level, the up/down counter 62 increments the second count value based on the clock signal. When the down signal DOWN2a is at a high level, the up/down counter 62 decrements the second count value based on the clock signal.

The counter 63 counts clock pulses. When the counter 63 has a 5-bit count width, the counter 63 outputs a count value in a range of 0 to 31. The counter 63 cyclically outputs counts 0 to 31.

The decoder 64 determines the logic values of the up signal UP3 and down signal DOWN3 based on the value indicated by the frequency difference signal FP and the count value outputted from the counter 63. Note that, when the up signal UP2a being 1 or the down signal DOWN2a being 1 consecutively occurs a larger number of times, the frequency difference between the receive data RD and the transmit clock signal CLK is larger. The decoder 64 outputs, based on the frequency difference signal FP and the count value of the counter 63, the up signal UP3=1 or down signal DOWN3=1 at a frequency proportional to the magnitude of the frequency difference between the receive data RD and the transmit clock signal CLK. This processing is performed, for example, based on a truth table containing, for example, the count value of the counter 63 and output values (UP4/DOWN4) corresponding to combinations of the up/down signals UP2a/DOWN2a.

The mixer 25 generates a phase selection signal based on the up signal UP2 and down signal DOWN2 and also based on the up signal UP3 and down signal DOWN3. The phase selection signal contains an up signal UP4 and a down signal DOWN4. The phase interpolator 26 outputs, by interpolating the phase of the transmit clock signal, a clock signal corresponding to the phase specified by the phase selection signal as the receive clock signal RCLK. In the present embodiment, the phase detector 21 uses two clock signals differing 180° in phase from each other as receive clock signals, so that the receive clock signal RCLK outputted from the phase interpolator 26 contains two signals. The number of clock signals outputted as the receive clock signal RCLK and the phase difference between them can be adjusted according to the configuration of the phase detector 21.

The frequency error adjustor 14 will be described next. As shown in FIG. 5, the frequency error adjustor 14 includes an adder 31, a delay circuit 32, a multiplier 33, and a switch 34. The adder 31 adds the value indicated by the data outputted from the delay circuit 32 and the value indicated by the frequency difference signal FP, and outputs the sum to the multiplier 33. The delay circuit 32 receives the output signal of the adder 31 and outputs the received signal after delaying it by one clock to the adder 31. The multiplier 33 multiplies the value indicated by the output signal of the adder 31 by the value indicated by a gain signal received from outside and, thereby, adjusts the relationship between the output signal of the adder 31 and the degree of correction of the receive clock frequency. The output signal of the multiplier 33 is used as the frequency adjustment signal Fadj. Namely, in the frequency error adjustor 14, the value indicated by the frequency adjustment signal Fadj is increased or decreased by integrating, from when operation is started, the value indicated by the frequency difference signal FP. The switch 34 is provided to precede the adder 31. The switch 34 is switched between a conducting state and a non-conducting state according to the frequency error adjustment enable signal Adjen. To be more concrete, when the frequency error adjustment enable signal Adjen is active, the switch 34 allows the frequency difference signal FP to be supplied to the adder 31 to activate the frequency error adjustor 14. When the frequency error adjustment enable signal Adjen is not active, the switch 34 does not allow the frequency difference signal FP to be supplied to the adder 31, so that the frequency error adjustor 14 is deactivated.

The PLL circuit 12 includes a feedback circuit and generates the transmit clock signal CLK by multiplying the reference clock signal Fsrc using the feedback circuit. The PLL circuit 12 controls the frequency of the transmit clock signal CLK by adjusting the frequency dividing ratio of a frequency divider provided in the feedback circuit using the frequency adjustment signal Fadj or SSC control signal Sadj.

In the following, the operation of the device 2 will be described.

The device 2 has two operation modes, normal operation mode and correction mode.

In normal operation mode, the device 2 exchanges data with the host 1. The normal operation mode includes four cases: SSC is applied to both the receive data RD and the transmit data TD; SSC is applied to the transmit data TD only; SSC is applied to neither of the receive data RA and the transmit data TD; and SSC is applied to the receive data RD only.

A case of SSC being applied to both the receive data RD and the transmit data TD occurs, for example, when the spectrum of the clock signal superimposed on the data transmitted from the host 1 (receive data RD) is spread (i.e. SSC is applied to the receive data RD) whereas, on the device 2 side, the transmit clock signal CLK is made to track the receive clock signal RCLK reproduced from the receive data RD to which SSC has been applied. In this case, neither the SSCG circuit 19 nor the data stored in the non-volatile memory 20 is used. That is, when SSC is applied to the receive data RD, SSC is inevitably applied to the transmit data TD.

When SSC is applied to the transmit data TD only, the SSCG circuit 19 and the data stored in the non-volatile memory 20 are used. In this case, the data to be stored in the non-volatile memory 20 is generated in correction mode.

In correction mode, the receive signal RXin superimposed with a clock signal whose spectrum has not been spread is inputted to the device 2 from the host 1 or a clock generator, and the value of the frequency adjustment signal Fadj that causes the receive signal RXin and the transmit clock signal CLK to coincide with each other in frequency is stored in the non-volatile memory 20. The value of the frequency adjustment signal Fadj stored in the non-volatile memory 20 is used as a frequency adjustment value Nadj.

When SSC is applied to the transmit data TD only, the SSCG circuit 19 controls the frequency dividing ratio of the PLL circuit 12 using the frequency adjustment value Nadj stored in the non-volatile memory 20. Namely, when applying SSC to the transmit data TD only, the receive data RD is not subjected to SSC, so that, in the PLL circuit 12, the transmit clock signal CLK cannot be made to track the receive clock signal RCLK. Hence, the frequency adjustment signal Fadj required to make the transmit clock signal CLK track the receive clock signal RCLK is specified in correction mode and the specified frequency adjustment signal Fadj is stored in the non-volatile memory 20. Subsequently, in normal operation mode, the PLL circuit 12 does not make the transmit clock signal CLK track the receive clock signal RCLK and the SSCG circuit 19 spreads the spectrum of the transmit clock signal CLK based on the information (frequency adjustment value Nadj) stored in the non-volatile memory 20 in correction mode. This makes it possible to apply SSC to the transmit clock signal CLK while correcting the frequency error between the receive clock signal RCLK and the transmit clock signal CLK.

SSC is applied to neither of the receive data RD and the transmit data TD, for example, when, without the receive clock signal RCLK having been subjected to SSC, the SSCG circuit 19 is not operated in the device 2.

SSC is applied to the receive data RD only, for example, when, with the receive clock signal RCLK having been subjected to SSC, the transmit data TD is not subjected to SSC. Namely, in the device 2, the SSCG circuit 19 is not operated.

The above cases of operation will be described in detail below.

First, the case in which SSC is applied to both the receive data RD and the transmit data TD will be described.

In this case, the PLL circuit 12, the digital CDR 13 and the frequency error adjustor 14 operate to cause the transmit clock signal CLK to track the receive data RD to which SSC has been applied. Since SSC is applied to the receive data RD on the host 1 side, SSC is applied to the transmit data TD without requiring SSC to be applied again on the device 2 side.

In the following, the operations of the PLL circuit 12, the digital CDR 13 and the frequency error adjustor 14 will be described. In the digital CDR 13, the phase detector 21 compares the phases of the receive data RD and the receive clock signal RCLK. The receive clock signal RCLK contains plural clock signals of which one is used as the synchronous clock signal SCLK. The phase detector 21 outputs the up signal UP1 and the down signal DOWN1 that indicate whether or not the synchronous clock signal SCLK is behind or ahead of the receive data RD in phase.

The up signal UP1 and the down signal DOWN1 are averaged at the first integrator 22. The first integrator 22 outputs the up signal UP2 and the down signal DOWN2 based on the averaging processing. The up signal UP2 and the down signal DOWN2 are inputted to the mixer 25. The mixer 25 corrects the phase of the receive clock signal RCLK by controlling the up signal UP4 and the down signal DOWN 4 based on the up signal UP2 and the down signal DOWN 2. In this way, the digital CDR 13 performs phase control so as to bring the phase of the receive clock signal RCLK closer to the phase of the receive data RD.

Furthermore, when the receive data RD and the receive clock signal RCLK differ in frequency from each other, namely, when the receive data RD and the transmit clock signal CLK differ in frequency from each other, the digital CDR 13 corrects the frequency difference based on the frequency difference signal PP.

When the receive data RD is lower in frequency than the receive clock signal RCLK, the digital CDR 13 lowers the frequency of the receive clock signal RCLK by the clock selection method used by the phase interpolator 26. Also, the frequency error adjustor 14 and the PLL circuit 12 lower the frequency of the transmit clock signal CLK based on the frequency difference signal FP outputted by the digital CDR 13.

In this case, the phase detector 21 detects that the receive clock signal RCLK is ahead of the receive data RD in phase and sets the down signal DOWN1 to a high level. When the down signal DOWN1 is repeatedly received, the first integrator 22 sets the down signal DOWN2 to a high level. Based on the down signal DOWN2, the phase of the received clock signal RCLK is delayed in the phase interpolator 26. When the phase control processing performed in this way does not cause the down signal DOWN1 to be changed to a low level, the period of the down signal DOWN2 being high lengthens causing the value indicated by the frequency difference signal FP generated in the second integrator 23 to decrease.

The pattern generator 24 sets the down signal DOWN3 to a high level more frequently when the value indicated by the frequency difference signal FP is smaller and sets the up signal UP3 to a high level more frequently when the value indicated by the frequency difference signal PP is larger. Namely, when, in the phase detector 21, the down signal DOWN1 is at a high level for a longer period, the down signal DOWN3 outputted from the pattern generator 24 is caused to stay at a high level for a longer period. When the down signals DOWN2 and DOWN3 are both set to a high level, the mixer 25 sets the down signal DOWN4 to a high level. This virtually lowers the frequency of the receive clock signal RCLK outputted from the phase interpolator 26. When the frequencies of the receive data RD and receive clock signal RCLK come close to each other (or become identical), the periods during which the up signal UP1 and down signal DOWN1 outputted from the phase detector 21 stay at a high level become almost identical. This stabilizes the frequency of the receive clock signal RCLK.

When the value indicated by the frequency difference signal FP becomes smaller, the value indicated by the frequency adjustment signal Fadj generated by the frequency error adjustor 14 also becomes smaller. This causes the PLL circuit 12 to lower the frequency dividing ratio of the frequency divider included therein to thereby lower the frequency of the transmit clock signal CLK. When the frequency of the transmit clock signal CLK lowers, the frequency of the receive clock signal RCLK generated by interpolating the transmit clock signal CLK also lowers.

When the frequency of the receive data RD is higher than the frequency of the receive clock signal RCLK, the phase detector 21 detects that the receive clock signal RCLK is behind the receive data RD in phase and sets the up signal UP1 to a high level. When, as a result, the up signal UP1 is repeatedly received, the first integrator 22 sets the up signal UP2 to a high level. Based on the up signal UP2, the phase interpolator 26 advances the phase of the receive clock signal RCLK. When the phase control processing performed in this way does not cause the up signal UP1 to be changed to a low level, the period of the up signal UP2 being high lengthens causing the value indicated by the frequency difference signal FP generated in the second integrator 23 to increase.

When the value indicated by the frequency difference signal FP is larger, the pattern generator 24 makes the period during which the up signal UP3 stays at a high level longer. When the up signal UP2 and the up signal UP3 are both set to a high level, the mixer 25 sets the up signal UP4 to a high level. This virtually increases the frequency of the receive clock signal RCLK outputted from the phase interpolator 26. When the frequencies of the receive data RD and receive clock signal RCLK come close to each other (or become identical), the periods during which the up signal UP1 and down signal DOWN1 outputted from the phase detector 21 stay at a high level, respectively, become almost identical. This stabilizes the frequency of the receive clock signal RCLK.

When the value indicated by the frequency difference signal FP becomes larger, the value indicated by the frequency adjustment signal Fadj generated by the frequency error adjustor 14 also becomes larger. This causes the PLL circuit 12 to raise the frequency dividing ratio of the frequency divider included therein to thereby increase the frequency of the transmit clock signal CLK. When the frequency of the transmit clock signal CLK increases, the frequency of the receive clock signal RCLK generated by interpolating the transmit clock signal CLK also increases.

The operations of the device 2 performed in cases where SSC is applied to both the receive data RD and the transmit data TD have been described. As obvious from the above-described operations, when SSC is applied to the receive data RD, the frequency of the receive clock signal RCLK varies. As the PLL circuit 12 operates to make the transmit clock signal CLK to track the receive clock signal RCLK of a varying frequency, SSC is applied also to the transmit data TD. If, however, SSC is not applied to the receive data RD, SSC is not applied to the transmit data TD.

Hence, the SSCG circuit 19 is used to allow SSC to be applied to the transmit data TD even when SSC is not applied to the receive data RD.

Next, the operation in correction mode will be described.

Figure 8:
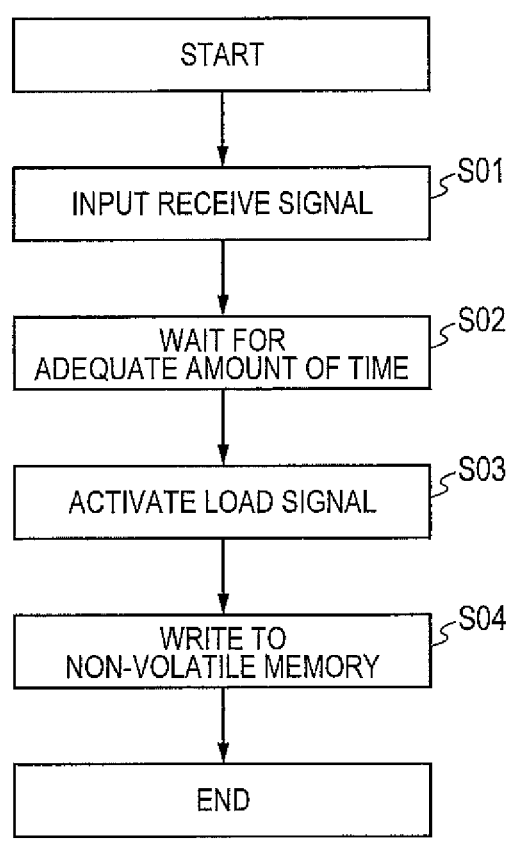
FIG. 8 is a flowchart of an example of operation of the device 2 in correction mode.

FIG. 8 is a flowchart of an example of operation in correction mode.

In step S01, the frequency error adjustment enable signal Adjen is activated (for example, set to a high level) and the SSCG enable signal Sscen is deactivated (for example, set to a low level), for example, by a CPU (Central Processing Unit) coupled to the device 2.

When the frequency error adjustment enable signal Adjen is activated and the SSCG enable signal Sscen is deactivated, the device 2 starts operation similar to that performed when SSC is applied, as described above, both to the receive data RD and the transmit data TD.

Namely, the reference signal generator 11 generates the reference clock signal Fsrc based on the clock signal OSC generated by an external ceramic oscillator. The PLL circuit 12 outputs the transmit clock signal CLK generated by multiplying the reference clock signal Fsrc. The receiving circuit 10 in which SSC is not applied, on the other hand, receives the receive signal RXin of adequately high accuracy and outputs the received signal as the receive data RD to the digital CDR 13. The digital CDR13 outputs the frequency difference signal FP to the frequency error adjustor 14. The frequency error adjustor 14 integrates the frequency difference signal FP and outputs (feeds back) the integrated signal as the frequency adjustment signal Fadj to the PLL circuit 12. The PLL circuit 12 controls the frequency dividing ratio based on the frequency adjustment signal Fadj. To be more concrete, the PLL circuit 12 outputs the transmit clock signal CLK after shifting it by a frequency corresponding to the frequency adjustment signal Fadj.

In step S02, the state generated in step S01 is maintained for a certain amount of time. Namely, the time needed before the receive data RD and the transmit clock signal CLK coincide with each other in frequency is secured.

Figure 9:
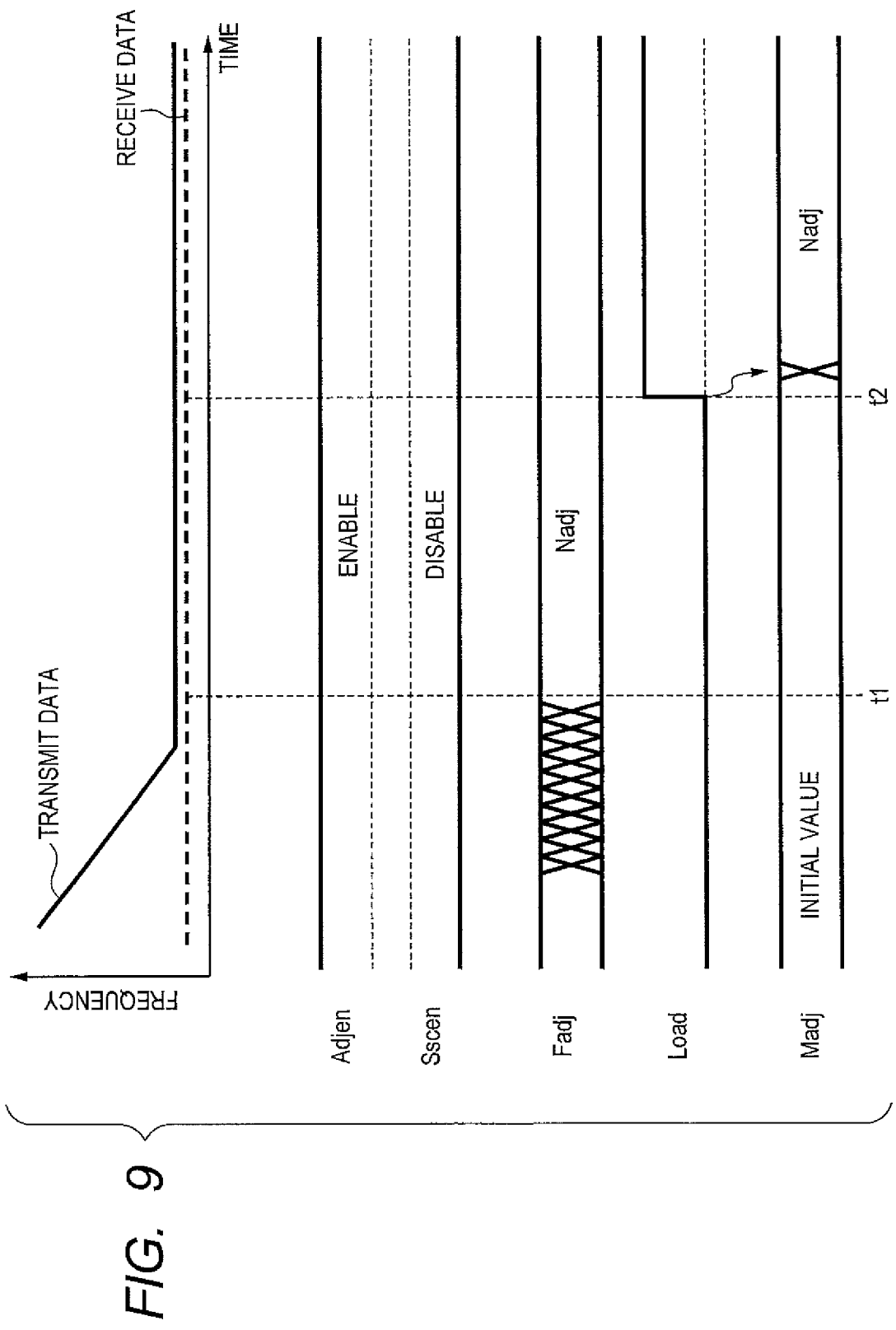
FIG. 9 shows examples of control signals used and transmit/receive data exchanged in correction mode.

FIG. 9 shows examples of control signals used and transmit/receive data exchanged in correction mode.

As shown in FIG. 9, immediately after operation is started in correction mode, the receive data RD and the transmit data TD do not coincide with each other in frequency, and the frequency adjustment signal Fadj widely varies. However, as the frequency error between the receive data RD and transmit data TD is reduced into a certain range, the frequency adjustment signal Fadj stops varying (at time t1). The value of the frequency adjustment signal Fadj after time t1 is made the frequency adjustment value Nadj. The state generated in step S01 is maintained until time t2, namely, until time t1 plus a margin. In this way, the frequency error between the receive data RD and the transmit data TD is securely converged.

In step S03, after passage of a certain period of time, the Load signal is activated, for example, from the CPU. In the non-volatile memory 20 with the Load signal activated, the current frequency adjustment value Nadj is stored (step S04). The operation in correction mode is performed as described above.

Next, the operation performed in normal mode to apply SSC to the transmit data TD only will be described.

Figure 10:
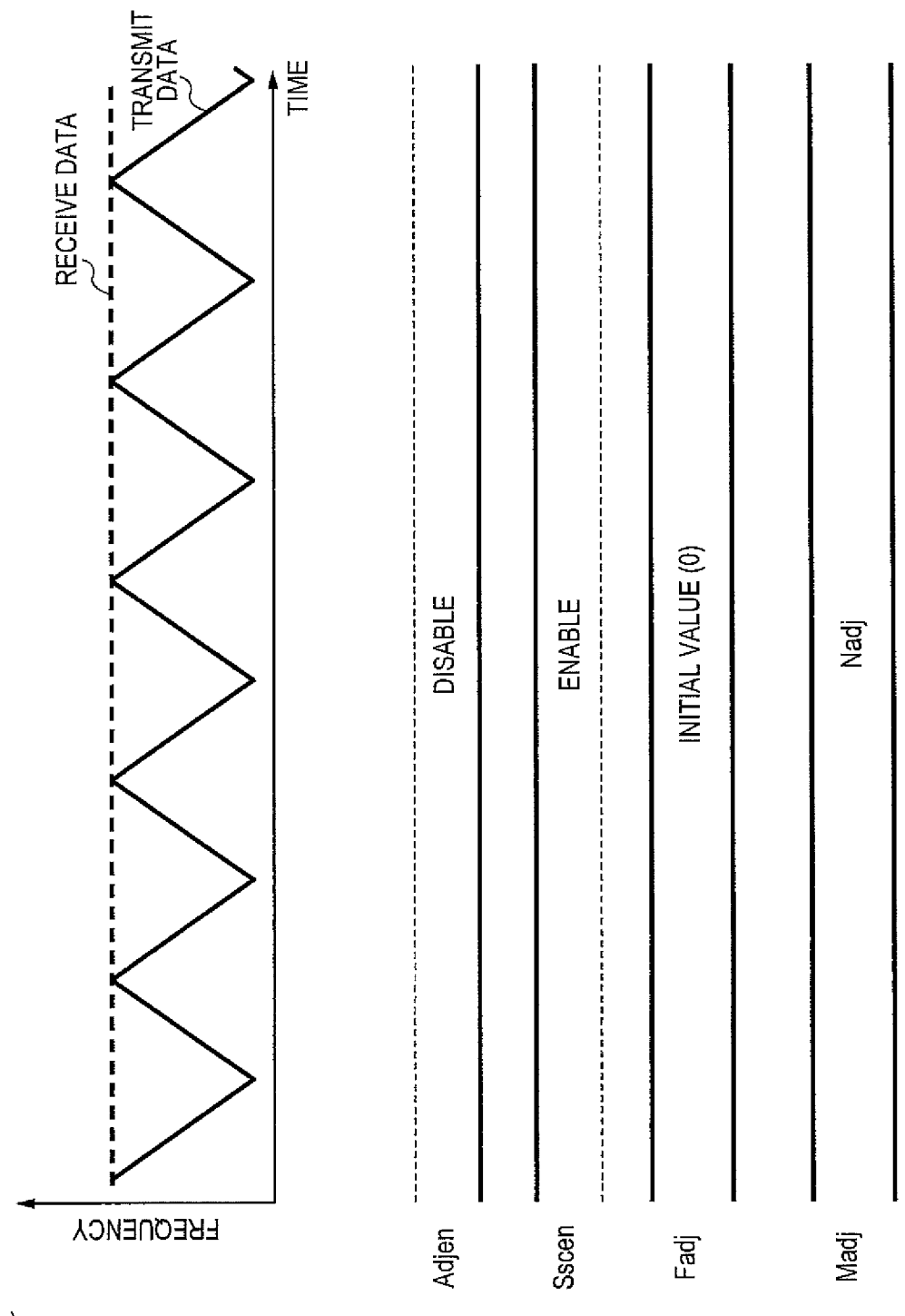
FIG. 10 shows examples of control signals used and transmit/receive data exchanged in normal operation mode.

FIG. 10 shows examples of control signals used and transmit/receive data exchanged in normal operation mode.

In this case, the frequency error adjustment enable signal Adjen is deactivated (for example, set to a low level). At the same time, the SSCG enable signal Sscen is activated (for example, set to a high level).

When the SSCG enable signal is active, the SSCG circuit 19 reads the frequency adjustment value Nadj stored in the non-volatile memory 20. Having read the frequency adjustment value Nadj, the SSCG circuit 19 generates the SSC control signal Sadj adjusted by a frequency corresponding to the frequency adjustment value Nadj. The PLL circuit 12 changes, based on the SSC control signal Sadj, the frequency dividing ratio and outputs the transmit clock signal CLK.

There may be cases in which, for whatever reason, SSC is not applied to the transmit data TD. Such cases occur when SSC is applied to neither of the receive data RD and the transmit data TD and when SSC is applied to the receive data RD only.

When SSC is applied to neither of the receive data RD and the transmit data TD, the SSCG enable signal Sscen is deactivated. Note that, when it is recognized in the device 2 by a method being described later that SSC has not been applied to the receive data RD, the transmit clock signal CLK can be made to track the receive clock signal CLK in the PLL circuit 12 by activating the frequency error adjustment enable signal Adjen. Alternatively, a transmit clock signal may be generated using the frequency adjustment value Nadj determined in correction mode and stored in the non-volatile memory 20 (in this case, the frequency error adjustment enable signal Adjen is not activated). Also in this case, since SSC is not applied to the transmit data TD, it is necessary to deactivate the SSCG enable signal Sscen.

Figure 11:
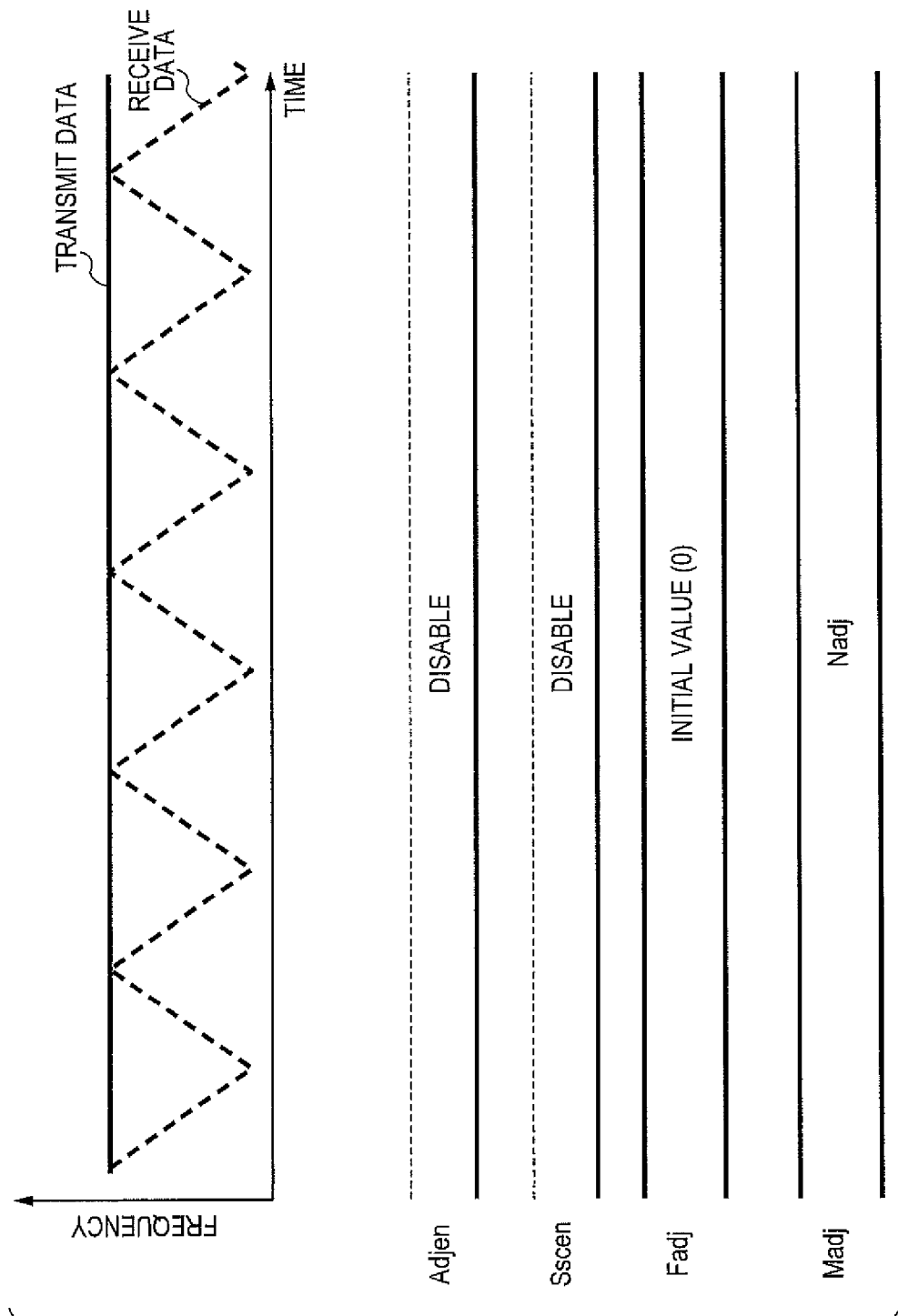
FIG. 11 shows examples of control signals used and transmit/receive data exchanged in normal operation mode.

When SSC is applied to the receive data RD only, the frequency error adjustment enable signal Adjen and the SSCG enable signal Sscen are both kept inactive. In this case, with SSC applied to the receive data RD, the frequency error adjustment enable signal Adjen is kept inactive not to make the transmit clock signal CLK track the receive clock signal RCLK. This is because making the transmit clock signal CLK track the receive clock signal RCLK results in having SSC applied to the transmit data TD. In addition, the SSCG enable signal Sscen is also kept inactive not to allow SSC application on the device 2 side, either (see FIG. 11). Note that keeping both the frequency error adjustment enable signal Adjen and the SSCG enable signal Sscen inactive makes it possible, avoiding dependence on the receive data RD, not to have SSC applied to the transmit data TD.

In cases where SSC has been applied to the receive data RD, it is undesirable to apply SSC again to the transmit data TD. Because doing so makes the width of modulation (spreading) of the transmit data TD too large. Hence, it should be possible to determine, on the device 2 side, whether or not SSC has been applied to the receive data RD. As a means of enabling such determination, a report of whether or not SSC has been applied to the receive data RD may be included in the receive data RD on the host 1 side so that, on the device 2 side, whether or not SSC has been applied to the receive data RD can be determined based on the receive data RD.

Or, alternatively, the host 1 and the device 2 may be coupled via a special signal line and whether or not SSC has been applied may be reported by means of a port state.

As described above, in the device in which the transmit clock signal CLK is generated based on the frequency error between the receive data RD and the transmit clock signal CLK, the frequency adjustment value Nadj obtained during operation in correction mode is stored in the non-volatile memory 20 and, in cases where SSC has not been applied to the receive data Rd, SSC is applied to the transmit data TD using the frequency adjustment value Nadj stored in the non-volatile memory 20. This makes it possible, even in cases where, for example, a low-accuracy ceramic oscillator is used to generate the transmit clock signal CLK, to generate the transmit clock signal CLK with high accuracy and apply SSC to the transmit data TD. Also, by not making the transmit clock signal CLK track the receive clock signal RCLK (with the frequency error adjustment enable signal Adjen kept inactive) and deactivating the SSC circuit 19 (with the SSCG enable signal Sscen kept inactive), it is possible, regardless of whether or not SSC has been applied to the receive data RD, not to apply SSC to the transmit data TD. Namely, whether or not to apply SSC to the transmit data TD can be arbitrarily selected.

Note that the inventors of the present invention have also filed Japanese Patent Application No. 2010-190686 disclosing a technique for correcting, in a clock and data recovery circuit, the frequency of a transmit clock signal at high speed based on the frequency error between receive data and an operation clock signal and that the disclosure of Japanese Patent Application No. 2010-190686 is incorporated herein by reference in its entirety.

Second Embodiment

A second embodiment of the present invention will be described in detail below with reference to drawings.

Figure 12:
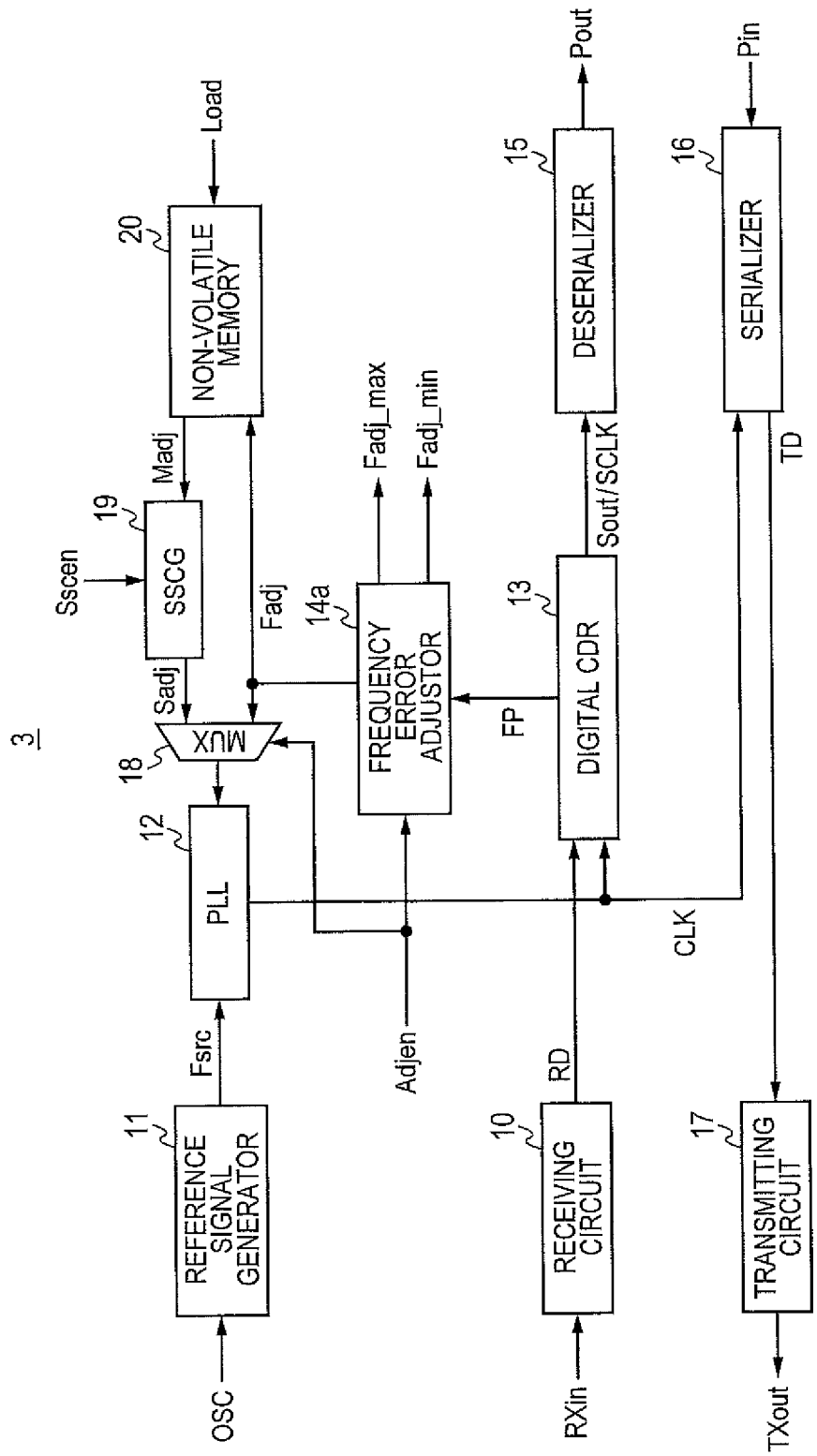
FIG. 12 shows an example internal configuration of a device 3 according to a second embodiment of the present invention.

FIG. 12 shows an example internal configuration of a device 3 according to the second embodiment of the present invention. In FIG. 12, constituent elements identical to those shown in FIG. 3 are denoted by reference numerals and symbols identical to those used in FIG. 3, and their description will be omitted in the following.

The device 3 differs from the device 2 in that, in the device 3, the frequency error adjustor 14a outputs a maximum value (Fadj_max) and a minim value (Fadj_min) of the frequency adjustment signal Fadj observed during a predetermined period of time.

When, with the device 3 in correction mode, the receive data RD and the transmit clock signal CLK are almost identical in frequency, variation of the frequency adjustment signal Fadj is small, so that a stable output is obtained. As a result, the difference between the maximum value Fadj_max and the minimum value Fadj_min of the frequency adjustment signal Fadj observed during a predetermined period of time becomes almost 0.

Figure 13:
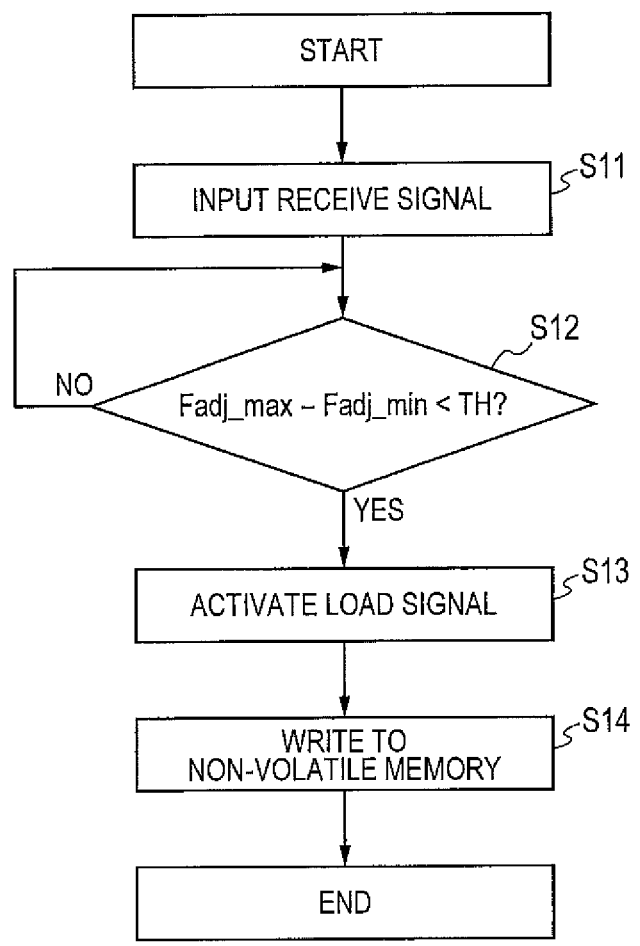
FIG. 13 is a flowchart of an example of operation of the device 3 in correction mode.

FIG. 13 is a flowchart of an example of operation of the device 3 in correction mode.

In the device 3 according to the present embodiment, whether or not the difference between the maximum value Fadj_max and the minimum value Fadj_min is smaller than a predetermined threshold TH is determined (step S12). When the difference is smaller than the threshold, the Load signal is activated, for example, by a CPU controlling the device 3 (step S13) and the current value of the frequency adjustment signal Fadj is stored in the non-volatile memory (step S14).

Figure 14:
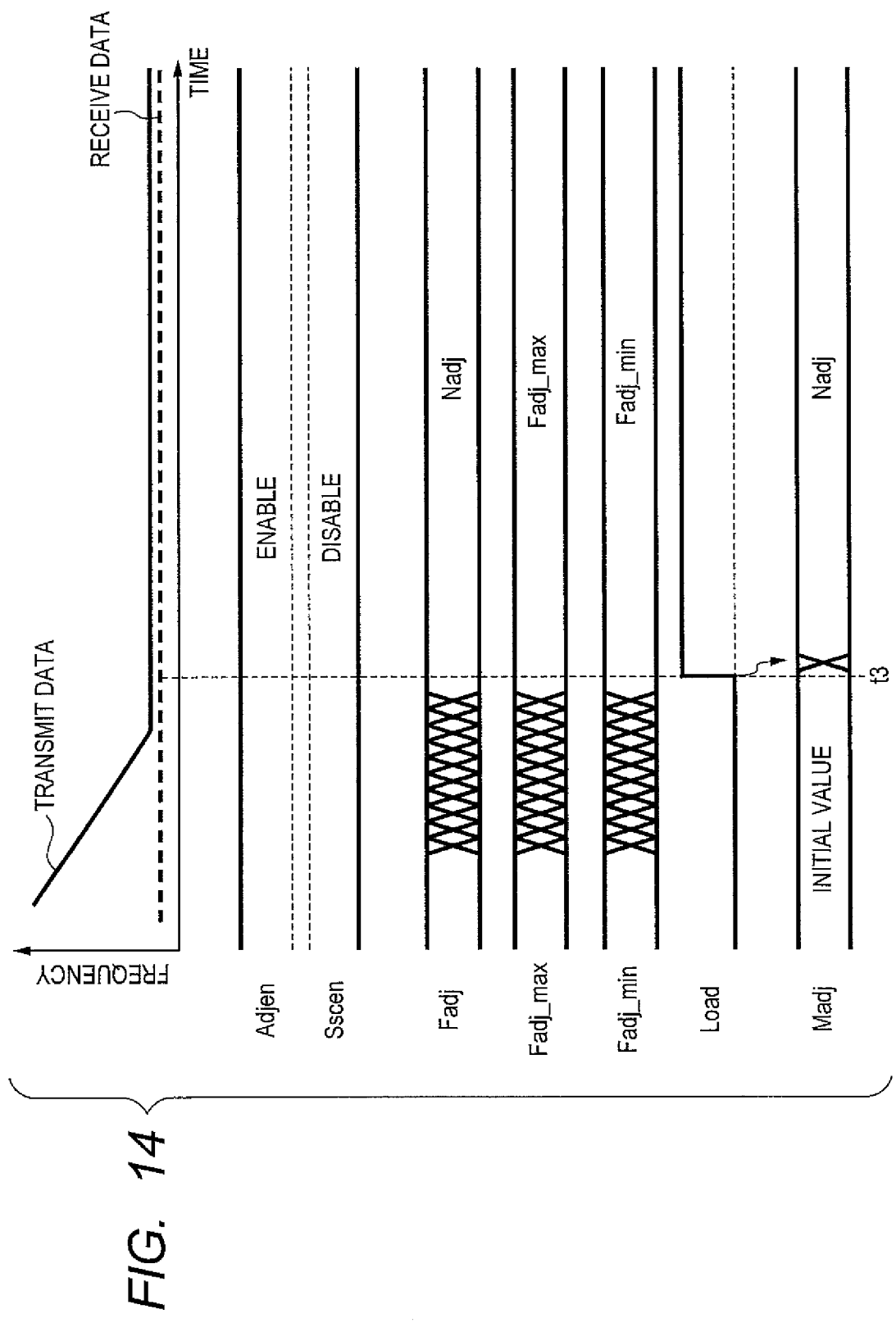
FIG. 14 shows examples of control signals used and transmit/receive data exchanged in correction mode.

FIG. 14 shows examples of control signals used and transmit/receive data exchanged in correction mode.

In the device 2 according to the first embodiment, the Load signal is activated after securing an adequate period of time (at time t2 shown in FIG. 9) to allow the frequency error between the receive data RD and the transmit data TD to be converged.

In the device 3 according to the present embodiment, the Load signal is activated after the difference between the maximum value Fadj_max and the minimum value Vadj_min is reduced to within a predetermined range (at time t3 shown in FIG. 14). This reduces the time used for operation in correction mode.

Third Embodiment

A third embodiment of the present invention will be described in detail below with reference to drawings.

In the third embodiment, the device 2 and the device 3 used in the first and the second embodiment are incorporated in a receiver, transmitter, or transceiver having a serial ATA interface.

As described above, there are cases in which an inexpensive ceramic oscillator is used to generate a reference clock signal in a receiver using a serial digital transmission system. Ceramic oscillators are, however, low in oscillation accuracy compared with crystal oscillators, and their oscillation frequency slightly differs between individual oscillators (i.e. they show initial deviations). Their oscillation frequency also varies according to ambient temperature changes and time-dependent changes in them.

The initial deviation of a ceramic oscillator can be corrected by the method in which, as described in connection with the first and second embodiments, the frequency dividing ratio of the PLL circuit 12 is controlled using the frequency adjustment signal Fadj.

According to the serial ATA interface standard, the frequency accuracy required in applying SSC is defined. To be more concrete, when SSC is applied, the frequency error must be in the range of +350 to −5350 ppm.

The initial deviation of a ceramic oscillator is considered to be correctable to a center value of the standard by controlling the frequency dividing ratio of the PLL circuit 12 using the frequency adjustment signal Fadj. It will, therefore, be satisfactory if the frequency error of the ceramic oscillator due to ambient temperature changes and time-dependent changes in the oscillator is reducible to within the frequency accuracy defined by the serial ATA interface standard.

Namely, even if a ceramic oscillator has a frequency error caused by temperature changes, etc., the SSCG circuit is to be controlled with the frequency error of the ceramic oscillator confined within an allowable range based on the serial ATA interface standard.

Figure 15:
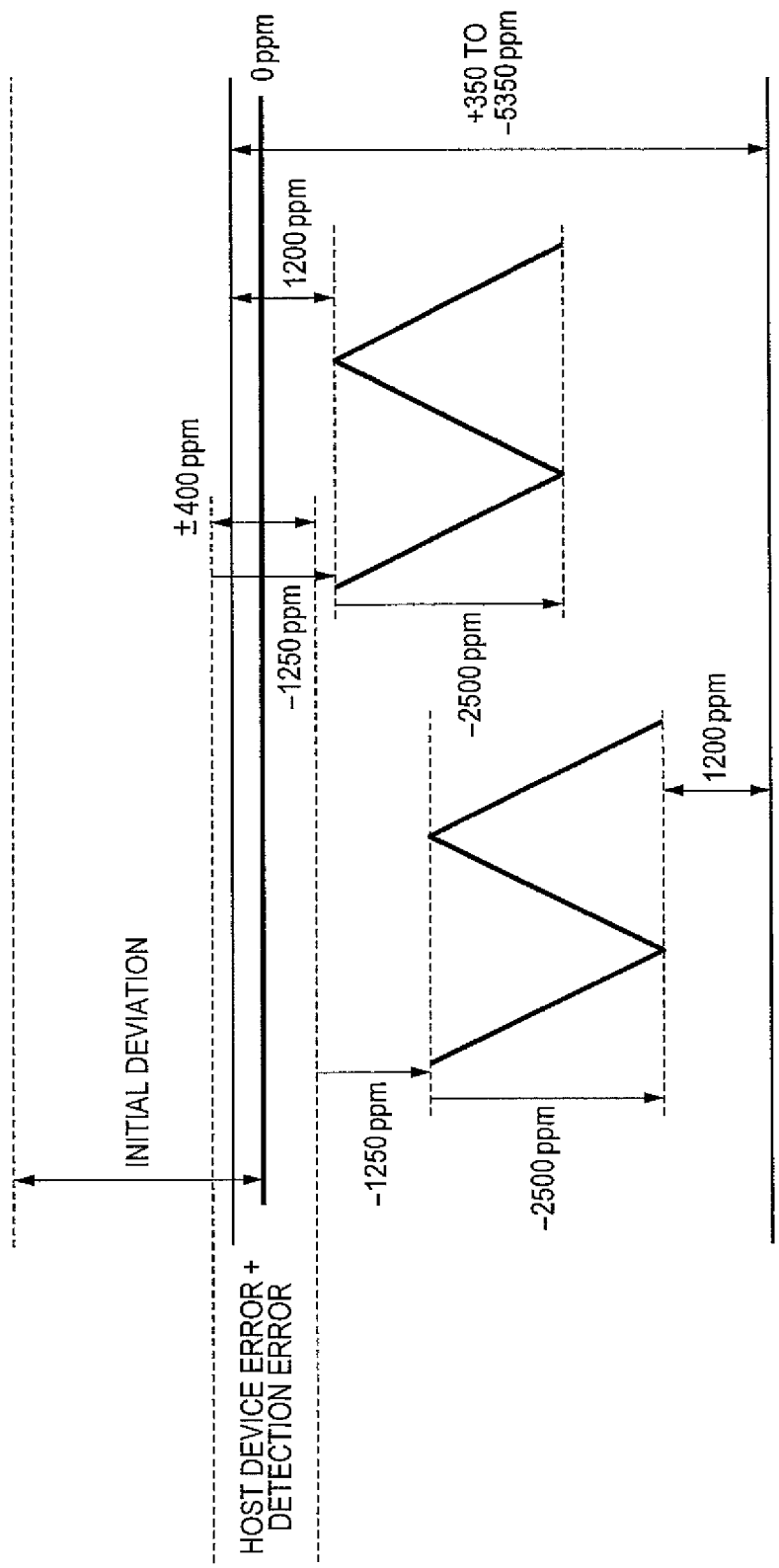
FIG. 15 shows an example of frequency deviation with a serial ATA (Advanced Technology Attachment) interface in use.

FIG. 15 is a diagram showing an example frequency deviation based on a serial ATA interface.

As described above, the serial ATA interface standard stipulates that, when SSC is applied, the frequency error is to be within the range of +350 to −5350 ppm. The specifications of the SSCG circuit 19 and the frequency error due to temperature changes, etc. of a ceramic oscillator are related as follows. The following description in this regard is based on the assumption that the host device used to correct the device 2 and device 3 has a frequency accuracy of ±350 ppm and that the digital CDR 13 and the frequency error adjustor 14 have a frequency detection accuracy of ±50 ppm.

Based on the above assumption, a frequency error due to temperature changes, etc. of 1200 ppm is allowable for the ceramic oscillator even when, for SSC to be carried out in the SSCG circuit 19, the modulation degree and maximum frequency deviation are defined to be −2500 ppm and −1250 ppm, respectively.

Thus, the initial deviation of a ceramic oscillator can be corrected using the frequency adjustment signal Fadj, so that only temperature changes, etc. need to be taken into consideration in designing the SSCG circuit 19. This makes designing a ceramic oscillator extremely easy. Thus, an inexpensive ceramic oscillator can be employed for a receiver, transmitter, or transceiver incorporating the device 2 or device 3 to achieve a cost reduction.

Fourth Embodiment

A fourth embodiment of the present invention will be described in detail below with reference to drawings.

In describing the first embodiment, a method for determining, on the device 2 side, whether or not SSC has been applied, on the host 1 side, to the transmit data (the receive data as seen on the device 2 side) has been described. In the fourth embodiment, a device 4 is used which can, as described in the following, determine whether or not SSC has been applied in the host 1 by a method different from that used in the first embodiment.

Figure 16:
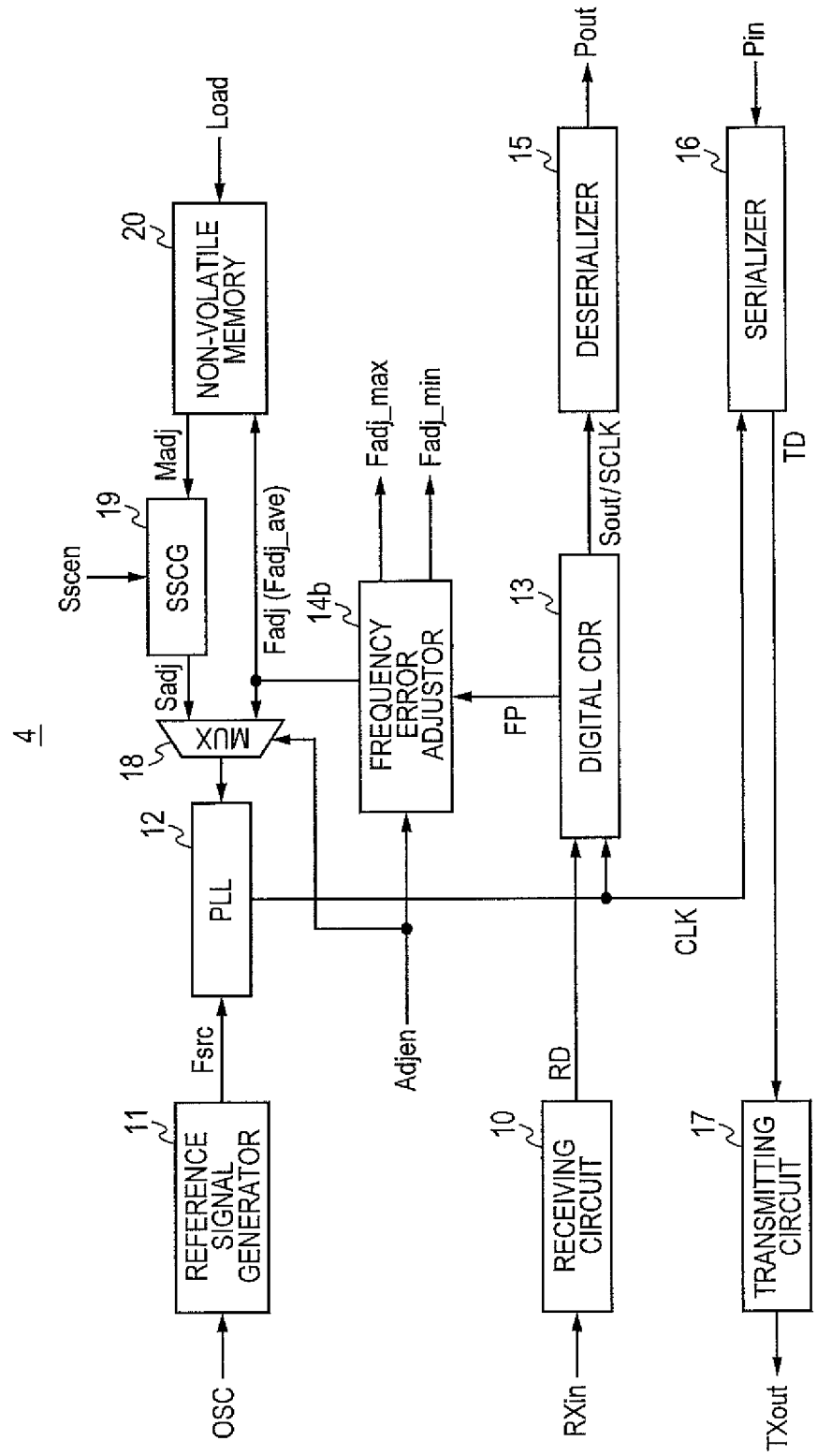
FIG. 16 shows an example internal configuration of a device 4 according to a fourth embodiment of the present invention.

FIG. 16 shows an example internal configuration of the device 4 according to the fourth embodiment. In FIG. 16, constituent elements identical to those shown in FIG. 12 are denoted by reference numerals and symbols identical to those used in FIG. 12, and their description will be omitted in the following.

The device 4 differs from the device 3 in that, in the device 4, an average value Fadj_ave of the frequency adjustment signal Fadj outputted from the frequency error adjustor 14b is calculated.

In the device 4 of the present embodiment, after passing of an adequate amount of time following a start of data reception, whether or not SSC has been applied to the data transmitted from the host 1 (the receive data as seen on the device 4 side) is determined based on the maximum value Fadj_max and minimum value Fadj_min of the frequency adjustment signal Fadj.

Depending on the result of the determination, whether or not to activate the SSCG circuit 19 of the device 4 is determined. By determining, when the device 4 is initially activated (when it is powered on), whether or not SSC has been applied to the data transmitted from the host 1, the frequency error caused by a time-dependent change in the ceramic oscillator can be absorbed.

Figure 17:
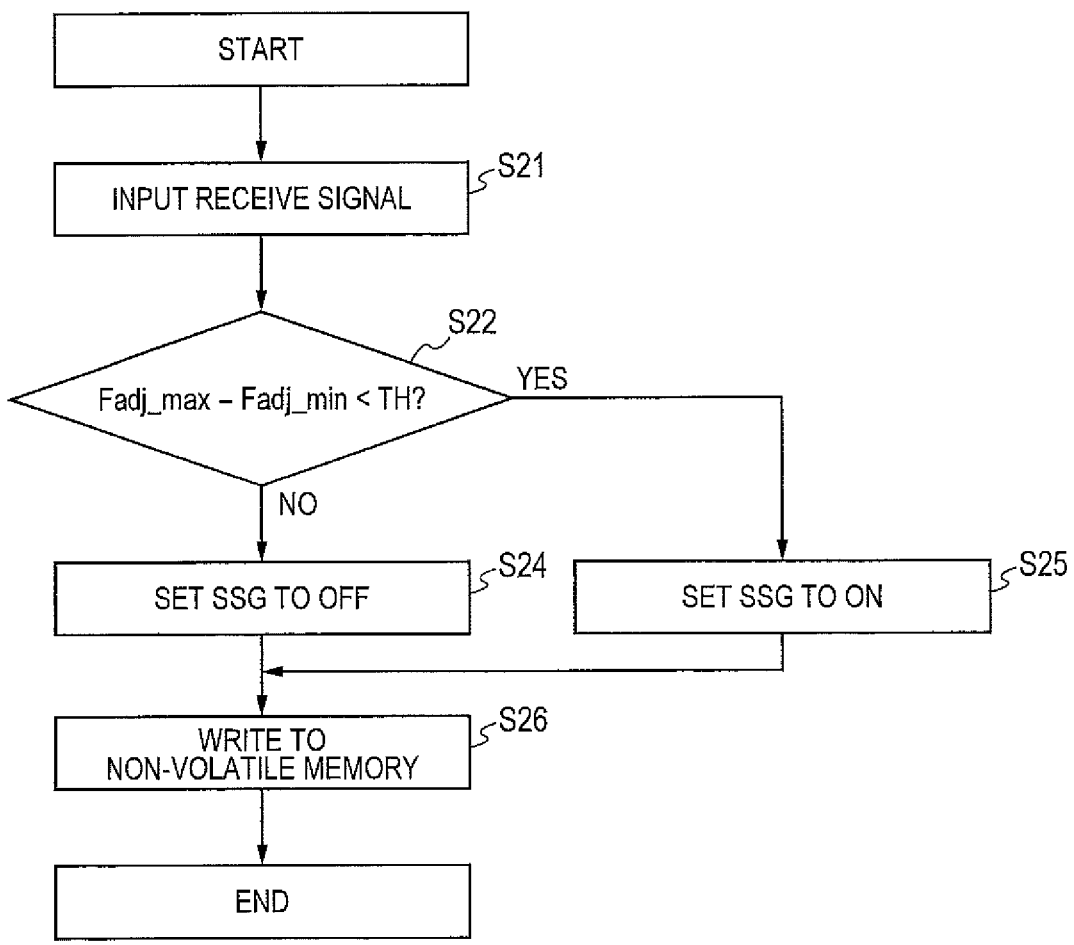
FIG. 17 is a flowchart of an example of initial activation of the device 4.

FIG. 17 is a flowchart of an example of initial activation of the device 4.

In the device 4, after data reception is started (step S21), the difference between the maximum value Fadj_max and the minimum value Fadj_min of the frequency adjustment signal Fadj is calculated, and the calculated difference is compared with a threshold TH (step S22). When the difference is equal to or larger than the threshold TH, SSC is determined to have been applied to the data transmitted from the host 1.

Figure 18:
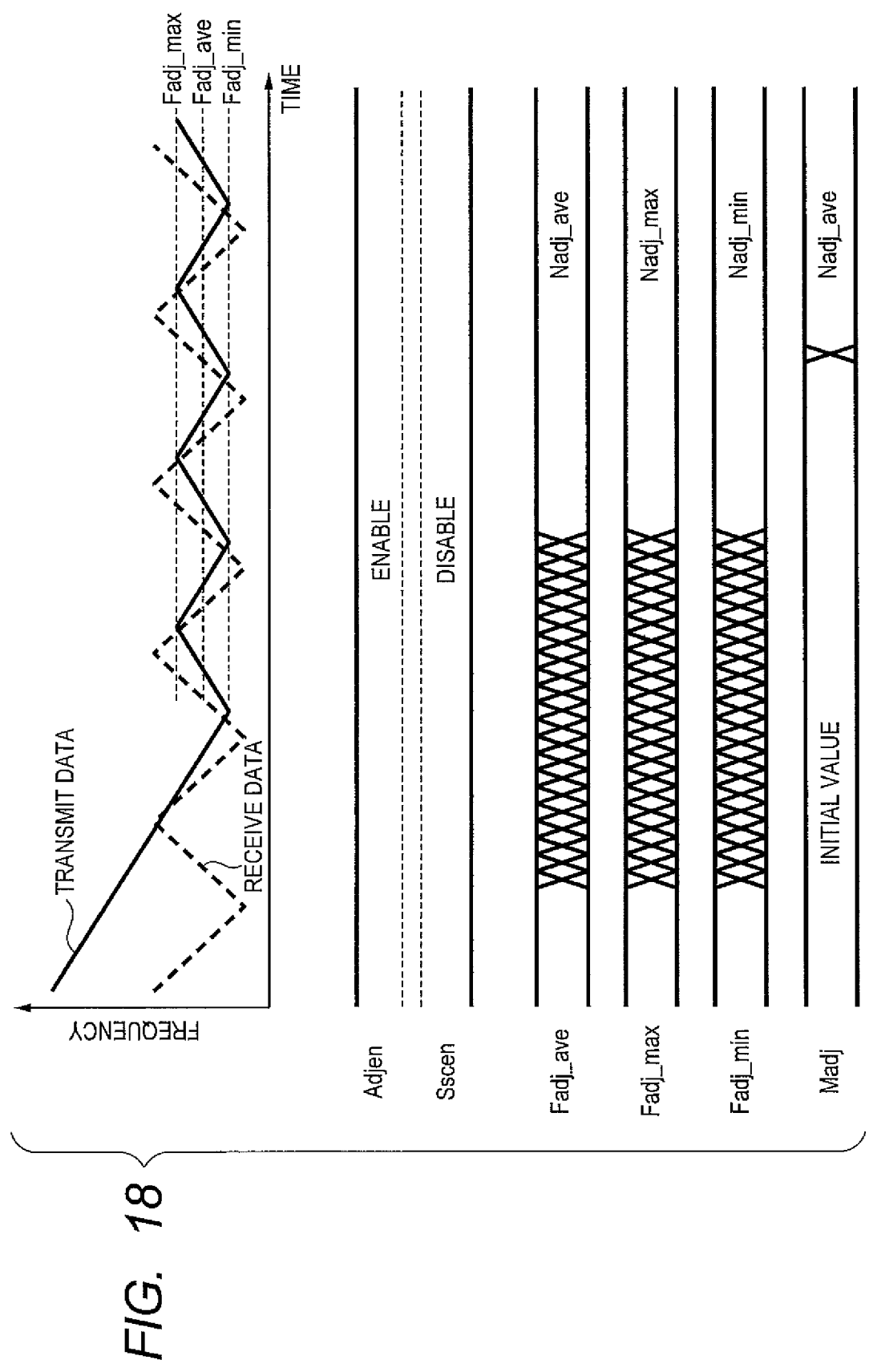
FIG. 18 shows examples of control signals used and transmit/receive data exchanged when the device 4 is initially activated.

FIG. 18 shows examples of control signals used and transmit/receive data exchanged when the device 4 is initially activated.

As shown in FIG. 18, when SSC is applied to the data transmitted by the host 1, the frequency adjustment signal Fadj varies in a certain range. Therefore, when the difference between the maximum value Fadj_max and the minimum value Fadj_min is not smaller than the threshold TH, it can be determined that SSC has been applied to the data transmitted from the host 1. In this case, processing advances to step S24.

When the difference between the maximum value Fadj_max and the minimum value Fadj_min is smaller than the threshold TH, it is determined that SSC has not been applied to the data transmitted from the host 1.

Figure 19:
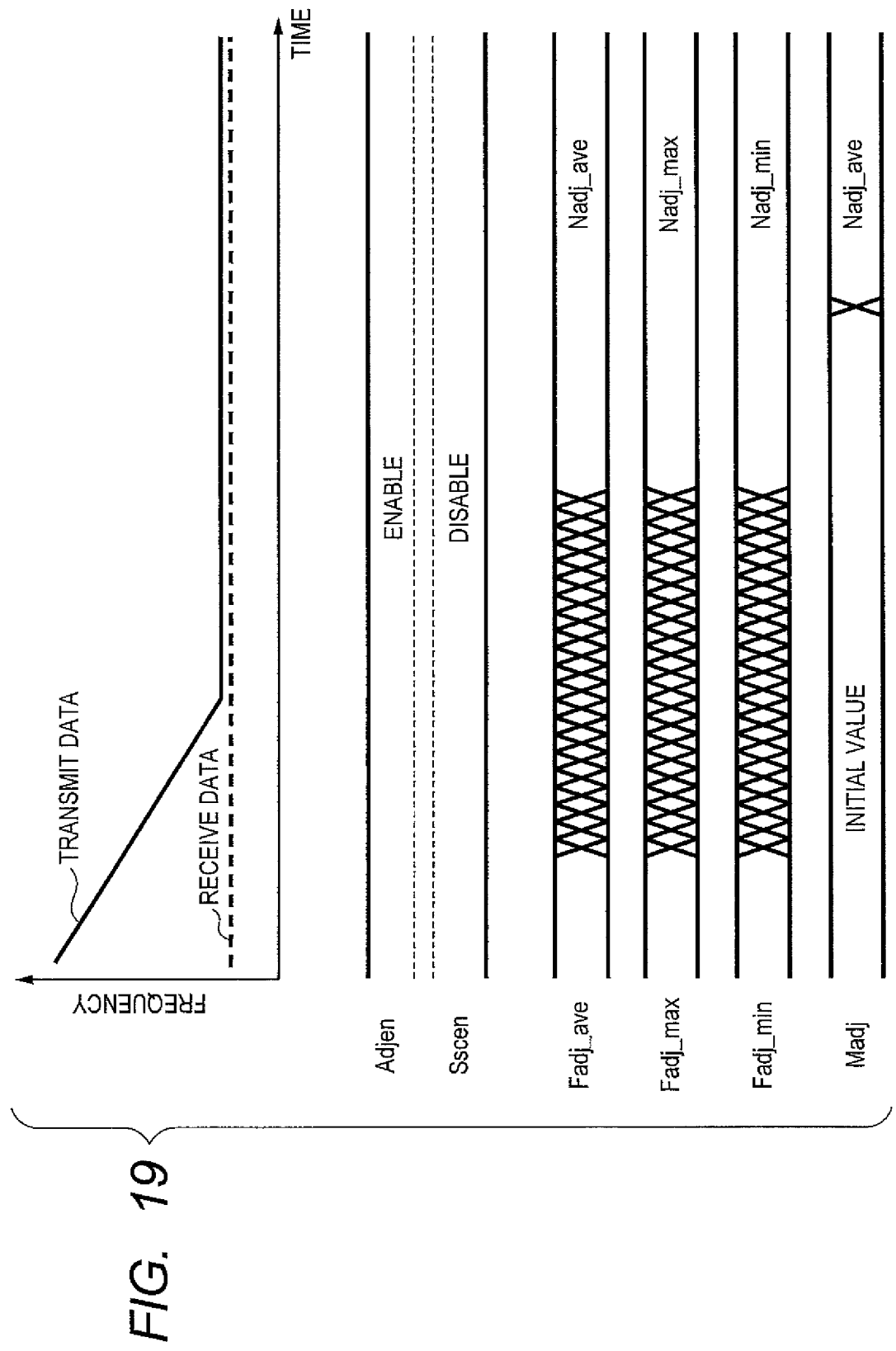
FIG. 19 shows examples of control signals used and transmit/receive data exchanged when the device 4 is initially activated.

FIG. 19 shows examples of control signals used and transmit/receive data exchanged when the device 4 is initially activated.

When SSC is not applied to the data transmitted from the host 1, the maximum value Fadj_max and the minimum value Fadj_min almost coincide. In this case, therefore, it can be determined that SSC has not been applied on the host 1 side and processing advances to step S25.

In step S24, the SSCG circuit 19 is deactivated (the SSCG enable signal Sscen is made inactive) by, for example, the CPU controlling the device 4. In step S25, the SSCG circuit 19 is activated (the SSCG enable signal Sscen is made active) by, for example, the CPU controlling the device 4.

Whether processing advances through step 924 or step S25, step 926 is performed to store the average value Fadj_ave of the frequency adjustment signal Fadj in the non-volatile memory 20. When, in the device 4, the state of SSC is changed from not being applied to being applied, application of SSC is realized as follows. Namely, when SSC has not been applied to the data transmitted from the host 1, the frequency dividing ratio of the PLL circuit 12 is controlled using the average value Fadj_ave of the frequency adjustment signal Fadj and, when SSC has been applied to the data transmitted from the host 1, the frequency error adjustment enable signal Adjen is activated to make the transmit clock signal CLK of the device 4 track the data transmitted from the host 1. In this way, SSC can be applied to the transmit clock signal CLK in the device 4 regardless of whether or not SSC has been applied to the data transmitted from the host 1.

As described above, when the device 4 is initially activated and communication with the host 1 is initially established, the device 4 determines whether or not SSC has been activated on the host 1 side. At the same time, the device 4 obtains the average value Fadj_ave of the frequency adjustment signal Fadj for use when applying SSC on the device 4 side. Based on the information thus obtained, setting of the SSCG circuit is changed as required in the device 4. This initial operation of the device 4 is performed when the device 4 is initially powered on, so that the frequency error caused by an initial deviation of or a time-dependent change in a ceramic oscillator can be absorbed.

Thus, control (design) of the SSCG circuit 19 only requires frequency errors which may be caused by temperature changes of the ceramic oscillator to be taken into consideration. This results in expanding the application range of SSC.

Note that the disclosures in the patent documents referred to above are incorporated herein by reference in their entirety. Within the scope of the whole disclosure (including the scope of the claims) of the present invention and based on the basic technical concept of the present invention, the modes and embodiments of the present invention can be modified or adjusted. Also, within the scope of the claims of the present invention, various elements of the disclosure (including elements of each claim, each embodiment and each drawing) can be combined or selected in diversified ways. Namely, it is obvious that the present invention can be altered and modified by any person skilled in the art based on the disclosure including the claims and the technical concept.

What is claimed is:

1. A semiconductor device, comprising:
a clock and data recovery unit to which a receive signal is inputted and which extracts, based on an operation clock signal, a clock signal and a data signal from the receive signal;
a frequency error adjusting unit which generates a frequency error signal indicating a frequency error between the clock signal extracted from the receive signal and the operation clock signal;
a frequency error signal storage unit which stores the frequency error signal;
an operation clock generation unit which controls, based on the frequency error signal, a frequency of the operation clock signal; and
a Spread Spectrum Clock Generator (SSCG) unit which varies the frequency of the operation clock signal by the SSCG unit based on the frequency error signal stored in the frequency error signal storage unit.

2. The semiconductor device according to claim 1, wherein the frequency error signal storage unit includes a non-volatile memory and stores the frequency error signal in the non-volatile memory.

3. The semiconductor device according to claim 1, further comprising a deserializer which converts the data signal serially extracted from the receive signal by the clock and data recovery unit into a parallel data signal.

4. The semiconductor device according to claim 1, further comprising a frequency error signal update control unit which obtains a maximum value and a minimum value of the frequency error signal over a predetermined period of time and which stores, when the difference between the maximum value and the minimum value is brought to or below a predetermined value, the frequency error signal in the frequency error signal storage unit.

5. The semiconductor device according to claim 1,
wherein a maximum value, a minimum value and an average value of the frequency error signal over a predetermined period of time are obtained and the average value is stored in the frequency error signal storage unit, and
wherein, when the difference between the maximum value and the minimum value is equal to or less than a predetermined value, the SSCG unit spreads the spectrum of the operation clock signal generated by the operation clock generation unit based on the average value stored in the frequency error signal storage unit instead of the frequency error signal stored in the frequency error signal storage unit and, when the difference between the maximum value and the minimum value is greater than the predetermined value, the SSCG unit does not spread the spectrum of the operation clock signal generated by the operation clock generation unit.

6. The semiconductor device according to claim 1, including a frequency error signal storing mode in which the frequency error signal storage unit is controlled to allow writing thereto.

7. The semiconductor device according to claim 1, wherein the clock and data recovery unit, the frequency error adjusting unit, the frequency error signal storage unit, the SSCG unit, and the operation clock generation unit are formed over a same semiconductor substrate.

8. The semiconductor device according to claim 1, further comprising a transmission unit which serially outputs data in synchronization with the operation clock signal.

9. The semiconductor device according to claim 8, further comprising a serializer which generates a transmit signal by converting a data signal to be outputted in synchronization with the operation clock signal.

10. The semiconductor device according to claim 1, wherein transmitting and receiving the receive signal conforms to the serial ATA (Advanced Technology Attachment) standard.

11. A receiver comprising the semiconductor device according to claim 1.

12. A transmitter comprising the semiconductor device according to claim 1.

13. A transceiver comprising the semiconductor device according to claim 1.

14. The semiconductor device according to claim 1, wherein the SSCG unit which, based on a value of the frequency error signal stored in the frequency error signal storage unit, varies the operation clock signal generated by the operation clock generation unit by spreading a spectrum of the operation clock signal.

15. The semiconductor device according to claim 1, wherein a spread spectrum clock comprising the operation clock signal having a spectrum spread by the SSCG unit is optionally applied to a transmit signal.

16. The semiconductor device according to claim 1, wherein a spread spectrum clock comprising the operation clock signal having a spectrum spread by the SSCG unit is selectively applied to a transmit signal depending on the receive signal.

17. A communication system comprising a first transceiver and a second transceiver each being capable of generating an operation clock signal, transmitting data in synchronization with the operation clock signal, and extracting data from a receive signal transmitted from a transmitting source in synchronization with an operation clock signal used at the transmitting source,
wherein each of the first transceiver and the second transceiver includes a Spread Spectrum Clock Generator (SSCG) function which can vary the operation clock signal for use in transmitting the data by spreading a spectrum of the operation clock signal,
wherein the second transceiver receives a signal transmitted from the first transceiver with the SSCG function of the first transceiver off, the second transceiver including a frequency error correction mode in which a frequency error between the operation clock signal of the first transceiver and the operation clock signal of the second transceiver is determined based on the signal received from the first transceiver and the operation clock signal of the second transceiver and in which the frequency of the operation clock signal of the second transceiver is corrected based on the determined frequency error, and
wherein, when it is determined, based on the signal received from the first transceiver, that the SSCG function of the first transceiver is on, the second transceiver performs communication inhibiting the SSCG function of the second transceiver and, when it is determined, based on the signal received from the first transceiver, that the SSCG function of the first transceiver is off, the second transceiver cancels the inhibition of the SSCG function of the second transceiver and performs communication based on the operation clock signal corrected in the frequency error correction mode.

18. The communication system according to claim 17, wherein a spread spectrum clock comprising the operation clock signal having a spectrum spread by the SSCG function on each of the first and second transceivers is optionally applied to a transmit signal.

19. A method for a semiconductor device, the method comprising:

extracting, by a clock and data recovery unit to which a receive signal is inputted, a clock signal and a data signal from the receive signal based on an operation clock signal;

generating, by a frequency error adjusting unit, a frequency error signal indicating a frequency error between the clock signal extracted from the receive signal and the operation clock signal;

storing, by a frequency error signal storage unit, the frequency error signal;

controlling, by an operation clock generation unit, a frequency of the operation clock signal based on the frequency error signal; and varying, by a Spread Spectrum Clock Generator (SSCG) unit, the frequency of the operation clock signal by the SSCG unit based on the frequency error signal stored in the frequency error signal storage unit.

20. The method according to claim 19, further comprising selectively applying to a transmit signal, a spread spectrum clock comprising the operation clock signal having a spectrum spread by the SSCG unit.

* * * * *